(12) United States Patent
Clark et al.

(10) Patent No.: US 8,811,068 B1
(45) Date of Patent: Aug. 19, 2014

(54) INTEGRATED CIRCUIT DEVICES AND METHODS

(75) Inventors: Lawrence T. Clark, Phoenix, AZ (US); Scott E. Thompson, Gainesville, FL (US); Richard S. Roy, Dublin, CA (US); Robert Rogenmoser, Santa Clara, CA (US); Damodar R. Thummalapally, Milpitas, CA (US)

(73) Assignee: Suvolta, Inc., Los Gatos, CA (US)

( * ) Notice: Subject to any disclaimer, the term of this patent is extended or adjusted under 35 U.S.C. 154(b) by 259 days.

(21) Appl. No.: 13/471,353

(22) Filed: May 14, 2012

Related U.S. Application Data

(60) Provisional application No. 61/486,051, filed on May 13, 2011.

(51) Int. Cl.
*G11C 11/00* (2006.01)

(52) U.S. Cl.
USPC .................. 365/154; 365/189.11; 365/189.14

(58) Field of Classification Search
CPC ....... G11C 11/412; G11C 11/413; G11C 8/08
USPC ................................. 365/154, 189.11, 189.14
See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |

(Continued)

FOREIGN PATENT DOCUMENTS

| | | |
|---|---|---|
| EP | 0274278 A1 | 7/1988 |
| EP | 0312237 A2 | 4/1989 |

(Continued)

OTHER PUBLICATIONS

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, 1995, pp. 23-24.

(Continued)

*Primary Examiner* — Son Dinh
*Assistant Examiner* — Nam Nguyen

(57) ABSTRACT

An integrated circuit can include SRAM cells, with pull-up transistors, pull-down transistors, and pass-gate transistors having a screening region positioned a distance below the gate and separated from the gate by a semiconductor layer. The screening region has a concentration of screening region dopants, the concentration of screening region dopants being higher than a concentration of dopants in the semiconductor layer. The screening region can provide an enhanced body coefficient for the pull-up transistors to increase a read static noise margin of the SRAM cell when a bias voltage is applied to the screening region. Related methods are also disclosed.

33 Claims, 15 Drawing Sheets

(56) References Cited

U.S. PATENT DOCUMENTS

| | | | |
|---|---|---|---|
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,560,139 B2 | 5/2003 | Ma et al. |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,697,978 B1 | 2/2004 | Bear et al. |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |

(56) References Cited

U.S. PATENT DOCUMENTS

| | | |
|---|---|---|
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,891,745 B2 | 5/2005 | Liaw |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,221,581 B2 | 5/2007 | Jacquet et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,327,598 B2 | 2/2008 | Dang et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,570,525 B2 * | 8/2009 | Nii et al. ................. 365/189.11 |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,688,669 B2 | 3/2010 | McClure et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,802,210 B2 | 9/2010 | Bae et al. |
| 7,808,045 B2 | 10/2010 | Kawahara et al. |
| 7,808,410 B2 | 10/2010 | Kim et al. |
| 7,808,804 B2 | 10/2010 | Kwon |
| 7,811,873 B2 | 10/2010 | Mochizuki |

(56) References Cited

U.S. PATENT DOCUMENTS

| | | |
|---|---|---|
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,920,438 B2 | 4/2011 | Yamaoka et al. |
| 7,926,018 B2 | 4/2011 | Moroz et al. |
| 7,934,181 B2 | 4/2011 | Hanafi et al. |
| 7,935,984 B2 | 5/2011 | Nakano |
| 7,940,550 B2 | 5/2011 | Behera et al. |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,001,493 B2 | 8/2011 | Joshi et al. |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,107,279 B2 | 1/2012 | Yamaoka et al. |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,112 B2 | 10/2012 | Miranda et al. |
| 8,286,180 B2 | 10/2012 | Foo |
| 8,288,798 B2 | 10/2012 | Passlack |
| 8,296,698 B2 | 10/2012 | Wang et al. |
| 8,299,562 B2 | 10/2012 | Li et al. |
| 8,324,059 B2 | 12/2012 | Guo et al. |
| 2001/0014495 A1 | 8/2001 | Yu |
| 2001/0038552 A1 | 11/2001 | Ishimaru |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0143423 A1 | 6/2008 | Komatsu et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |

(56) References Cited

U.S. PATENT DOCUMENTS

| | | |
|---|---|---|
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0080202 A1 | 4/2011 | Moore et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 A2 | 3/1993 |
| EP | 0683515 A1 | 11/1995 |
| EP | 0889502 A2 | 1/1999 |
| EP | 1450394 A1 | 8/2004 |
| JP | 59193066 A1 | 1/1984 |
| JP | 4186774 A1 | 3/1992 |
| JP | 8288508 A1 | 1/1996 |
| JP | 8153873 A1 | 6/1996 |
| JP | 2004087671 A1 | 3/2004 |
| KR | 10-0794094 B1 | 7/2003 |
| WO | 2011062788 A1 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, 2001, pp. 29.1.1-29.1.4.

Ducroquet, F et al. "Fully Depleted Silicon-On-Insulator nMOSFETs with Tensile Strained High Carbon Content Si1-yCy Channel", 2006, ECS 210th Meeting, Abstract 1033.

Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.

Goesele, U et al., Diffusion Engineering by Carbon in Silicon, 2000, Mat. Res. Soc. Symp. vol. 610.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113.

Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.

Holland, OW and Thomas, DK "A Method to Improve Activation of Implanted Dopants in SiC", 2001, Oak Ridge National Laboratory, Oak Ridge, TN.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.

Lavéant, P. "Incorporation, Diffusion and Agglomeration of Carbon in Silicon", 2002, Solid State Phenomena, vols. 82-84, pp. 189-194.

Noda, K et al., "A 0.1-µm Delta-Doped MOSFET Fabricated with Post-Low-Energy Implanting Selective Epitaxy", 0411998, IEEE Transactions on Electron Devices, vol. 45, No. 4, pp. 809-814.

Ohguro, T et al., "An 0.18-µm CMOS for Mixed Digital and Analog Aplications with Zero-Volt-Vth Epitaxial-Channel MOSFET's", Jul. 1999, IEEE Transactions on Electron Devices, vol. 46, No. 7, pp. 1378-1383.

Pinacho, R et al., "Carbon in Silicon: Modeling of Diffusion and Clustering Mechanisms", Aug. 2002, Journal of Applied Physics, vol. 92, No. 3, pp. 1582-1588.

Robertson, LS et al., "The Effect of Impurities on Diffusion and Activation of Ion Implanted Boron in Silicon", 2000, Mat. Res. Soc. Symp. vol. 610.

Scholz, R et al., "Carbon-Induced Undersaturation of Silicon Self-Interstitials", Jan. 1998, Appl. Phys. Lett. 72(2), pp. 200-202.

Scholz, RF et al., "The Contribution of Vacancies to Carbon Out-Diffusion in Silicon", Jan. 1999, Appl. Phys. Lett., vol. 74, No. 3, pp. 392-394.

Stolk, PA et al., "Physical Mechanisms of Transient Enhanced Dopant Diffusion in Ion-Implanted Silicon", May 1997, J. Appl. Phys. 81(9), pp. 6031-6050.

Thompson, S et al., "MOS Scaling: Transistor Challenges for the 21st Century", 1998, Intel Technology Journal Q3'1998, pp. 1-19.

Wann, C. et al., "Channel Profile Optimization and Device Design for Low-Power High-Performance Dynamic-Threshold MOSFET", 1996, IEDM 96, pp. 113-116.

Banerjee et al, "Compensating Non-Optical Effects using Electrically-Driven Optical Proximity Correction", Proc. of SPIE, vol. 7275, 2009.

Cheng et al, "Extremely Thin SOI (ETSOI) CMOS with Record Low Variability for Low Power System-on-Chip Applications", IEDM 2009, Dec. 2009.

Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.

Drennan et al., "Implications of Proximity Effects for Analog Design", Custom Integrated Circuits Conference, 2006, CICC '06, IEEE, Sep. 10-13, 2006, pp. 169-176.

Hook et al., "Lateral Ion Implant Straggle and Mask Proximity Effect", IEEE Transactions on Electron Devices, vol. 50, No. 9, Sep. 2003.

Hori et al., "A 0.1 um CMOS with a Step Channel Profile Formed by Ultra High Vacuum CVD and In-Situ Doped Ions", IEDM 1993, May 12, 1993.

Matsuhashi et al., "High-Performance Double-Layer Epitaxial-Channel PMOSFET Compatible with a Single Gate CMOSFET", 1996 Symposium on VLSI Technology Digest of Technical Papers, 1996.

Shao et al., "Boron diffusion in silicon: the anomalies and control by point defect engineering", Materials Science and Engineering R 42 (2003), Nov. 2003, pp. 65-114.

Sheu et al., "Modeling the Well-Edge Proximity Effect in Highly Scaled MOSFETs", IEEE Transactions on Electron Devices, vol. 53, No. 11, Nov. 2006, pp. 2792-2798.

English Abstract of JP2004087671 submitted herewith.
English Abstract of JP4186774 submitted herewith.
English Abstract of JP59193066 submitted herewith.
English Abstract of JP8153873 submitted herewith.
English Abstract of JP8288508 submitted herewith.
English Translation of JP8288508 submitted herewith.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

(56) References Cited

OTHER PUBLICATIONS

Samsudin, K et al., Integrating Intrinsic Parameter Fluctuation Description into BSIMSOI to Forecast sub-15 nm UTB SOI based 6T SRAM Operation, Solid-State Electronics (50), pp. 86-93.

Wong, H et al., "Nanoscale CMOS", Proceedings of the IEEE, Vo. 87, No. 4, pp. 537-570.

Machine Translation of KR 10-0794094 Submitted herewith.

Werner, P et al., "Carbon Diffusion in Silicon", Oct. 1998, Applied Physics Letters, vol. 73, No. 17, pp. 2465-2467.

Yan, Ran-Hong et al., "Scaling the Si MOSFET: From Bulk to SOI to Bulk", Jul. 1992, IEEE Transactions on Electron Devices, vol. 39, No. 7.

\* cited by examiner

INTEGRATED CIRCUIT DEVICES AND METHODS

This application claims the benefit of U.S. Provisional Patent Application Ser. No. 61/486,051 filed on May 13, 2011, the contents of which are incorporated by reference herein.

TECHNICAL FIELD

This disclosure relates generally to semiconductor devices and integrated circuits and, more specifically, to a Static Random Access Memory (SRAM) device and a method of operation that enhances the performance of the SRAM device.

BACKGROUND

There are several interrelated design parameters that must be considered during SRAM cell design. These include, static noise margin (hereinafter "SNM"), write margin, bit line speed, and data retention voltage. SNM is defined as the minimum DC noise voltage necessary to flip the state of the SRAM cell. An SRAM cell can have different SNM during read and write operations, referred to as read SNM and write SNM, respectively. Read SNM is also an indicator of cell stability and is sometimes simply referred to as cell stability. A higher read SNM indicates that it is more difficult to invert the state of the cell during a read operation. Write margin is defined as the minimum bit line voltage necessary to invert the state of an SRAM cell. A higher write margin indicates that it is easier to invert the state of the cell during a write operation. Read speed is defined as the bit line slew rate in response to a high word line voltage, typically the time from the rising edge assertion of word line until some differential between the high and falling bit line is obtained. Data retention voltage is defined as the minimum power supply voltage required to retain a logic value in the SRAM cell in standby mode.

As process technology has scaled, it has become increasingly difficult to control the variation of transistor parameters because of a variety of factors, including, for example, Random Dopant Fluctuation (RDF). Other reasons for this variation include dopant scattering effect, such as the well proximity effect, that makes the placement of dopants in MOSFET transistors increasingly difficult as transistor size is reduced. Misplaced dopants can reduce transistor performance, increase transistor variability, including variability of channel transconductance, capacitance effects, threshold voltage, and leakage. Such variability increases as transistors are reduced in size, with each misplaced dopant atom having a greater relative effect on transistor properties, as a result of the overall reduction in the number of dopant atoms.

In part because of such random variations, threshold voltage variations have become a limiting factor in transistor design as process technology is scaled downward. The resulting threshold voltage variations between neighboring MOSFETs can have significant impact on the SNM, cell stability, write margin, read speed, and data retention voltage of the SRAM cell. For example, threshold voltage variations between pass-gate and pull-down transistors of the SRAM cell can significantly degrade cell stability. During a read, the read current discharging the bit line flows through the series connection of the pass-gate and pull-down NMOS transistors. The voltage divider formed by these transistors raises the low voltage in the cell, and may unintentionally cause the cell to flip when read. Variations in the threshold voltage of the pass-gate or pull-down transistor can result in a large variation in the voltage divider ratio of the pass-gate transistors and the pull down transistors, increasing the likelihood of inverting the SRAM cell during a read operation, i.e., upsetting the stored state. Other SRAM cell design parameters such as write margin, bit line speed (as measured by slew rate) or read current, and data retention voltage can also be affected by threshold voltage variations.

Attempts have been made to correct the adverse effect of threshold voltage variations on SRAM cell performance. For example, U.S. Pat. No. 7,934,181 titled, "Method and Apparatus for Improving SRAM Cell Stability by Using Boosted Word Lines", assigned to International Business Machines Corporation, sets out a boost voltage generator that applies a predetermined boosted word line voltage to the word line of a selected SRAM cell. The boosted word line voltage is predetermined for each SRAM cell, and is sufficiently higher than the power supply voltage of the SRAM cell to improve the cell stability to a desired level.

Alternatively, U.S. Patent Publication 20100027322 titled, "Semiconductor Integrated Circuit and Manufacturing Method Therefor", assigned to Renesas Technology Corp., sets out measuring the threshold voltages of PMOS and NMOS transistors of the SRAM, programming control information in control memories that are associated with PMOS and NMOS transistors based on the measurements, and adjusting the levels of the body bias voltages applied to the PMOS and NMOS transistors of the SRAM to compensate for the threshold voltage variations and improve manufacturing yield.

DETAILED DESCRIPTION

Figure 1A:
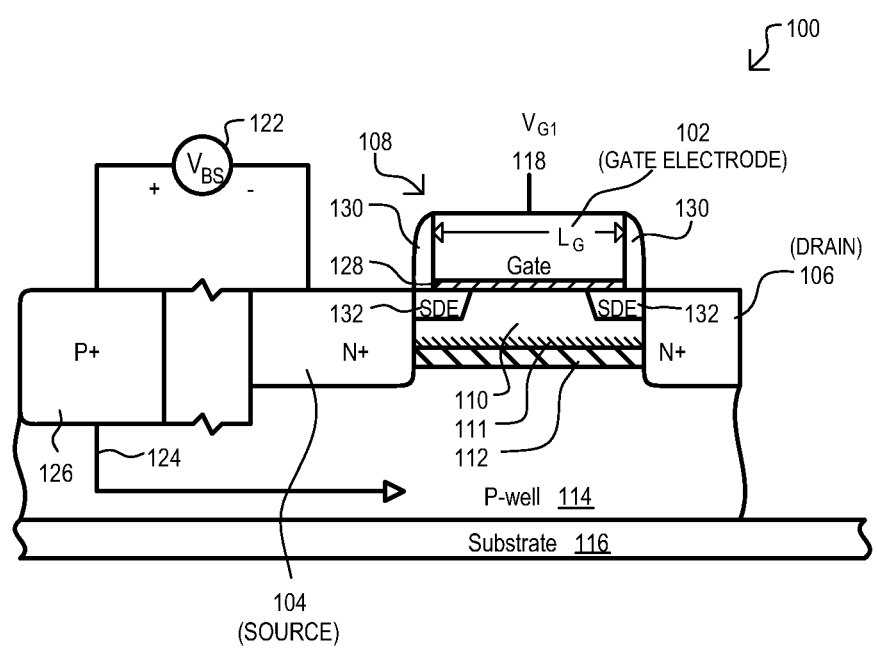
FIG. 1A illustrates an deeply depleted channel (DDC) transistor with a screening region, in accordance with one embodiment.

Various embodiments of the present invention will now be described in detail with reference to a number of drawings. The embodiments show circuits and methods related to an integrated circuit device having transistors that have an enhanced body coefficient. The embodiments described herein also show circuits and methods related to an integrated circuit having improved transistor matching, such that the transistors have reduced variability of threshold voltage and body coefficient. Particular embodiments may include static random access memories having enhanced performance characteristics as described herein.

In the various embodiments below, like items are referred to by the same reference character but with the leading digits corresponding to the figure number.

FIG. 1A shows an embodiment of a deeply depleted channel (DDC) transistor 100 having an enhanced body coefficient, along with the ability to set threshold voltage Vt with enhanced precision, according to certain described embodiments. The DDC transistor 100 includes a gate electrode 102, source 104, drain 106, and a gate dielectric 128 positioned over a substantially undoped channel 110. Lightly doped source and drain extensions (SDE) 132, positioned respectively adjacent to source 104 and drain 106, extend toward each other, setting the transistor channel length.

In FIG. 1A, the DDC transistor 100 is shown as an N-channel transistor having a source 104 and drain 106 made of N-type dopant material, formed upon a substrate such as a P-type doped silicon substrate providing a P-well 114 formed on a substrate 116. In addition, the N-channel DDC transistor in FIG. 1A includes a highly doped screening region 112 made of P-type dopant material, and a threshold voltage set region 111 made of P-type dopant material. However, it will be understood that, with appropriate changes to dopant materials, a P-channel DDC transistor can be formed.

Figure 1B:
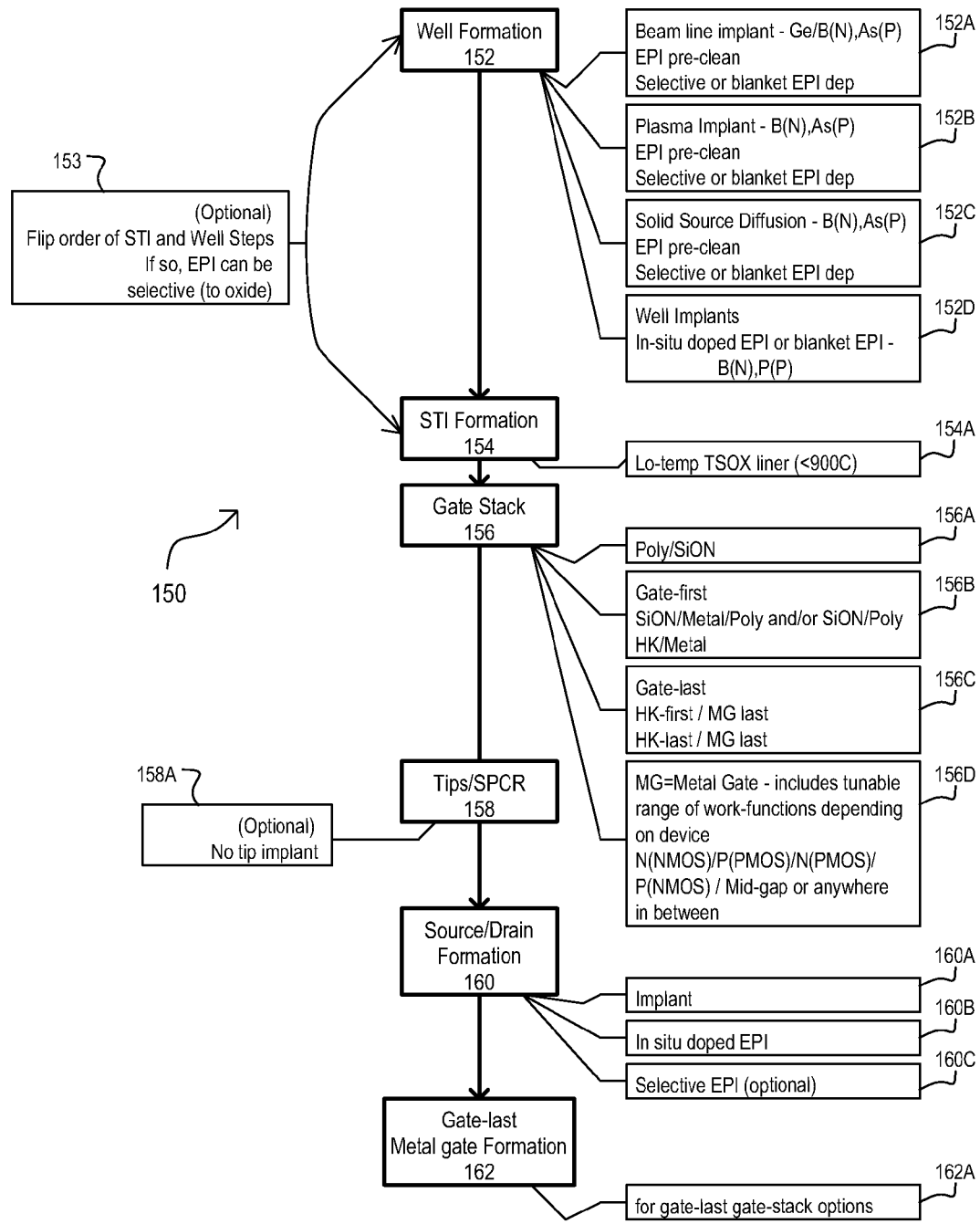
FIG. 1B is a flow diagram illustrating a general method for forming a DDC transistor having an enhanced body coefficient and reduced a Vt.

FIG. 1B is a flow diagram 150 illustrating a general method for forming a DDC transistor having an enhanced body coefficient and reduced σVt, in accordance with the various embodiments described herein. The process illustrated in FIG. 1B is intended to be general and broad in its description, and more detailed embodiments and examples are set forth below. Each block in the flow diagram is illustrated and described in further detail below, in conjunction with the various alternatives associated with each block illustrated in FIG. 1B.

In step 152, the process begins at well formation, which can include one or more different process steps in accordance with different embodiments. The well formation step 152 includes the steps for forming the screening region 112, the threshold voltage set region 111 (if present), and the substantially undoped channel 110. As indicated in 153, the well formation 152 can be before or after STI (shallow trench isolation) formation 154. The well formation 152 can include forming the screening region 112 by implanting dopants into the P-well 114, followed by an epitaxial (EPI) pre-clean process that is followed by a blanket or selective EPI deposition. Various alternatives for performing these steps are illustrated in FIG. 1B. In accordance with one embodiment, well formation 152 can include a beam line implant of Ge/B (N), As (P), followed by an epitaxial (EPI) pre-clean process, and followed by a non-selective blanket EPI deposition, as shown in 152A. Alternatively, the well formation 152 can include using a plasma implant of B (N), As (P), followed by an EPI pre-clean, then a non-selective (blanket) EPI deposition, as shown in 152B. The well formation 152 can alternatively include a solid-source diffusion of B(N), As(P), followed by an EPI pre-clean, and followed by a non-selective (blanket) EPI deposition, as shown in 152C. As yet another alternative, well formation 152 can also include well implants, followed by in-situ doped selective EPI of B (N), P (P) as shown in 152D. As will be described further below, the well formation can be configured with different types of devices in mind, including DDC transistors, legacy transistors, high $V_T$ transistors, low $V_T$ transistors, improved $\sigma V_T$ transistors, and standard or legacy $\sigma V_T$ transistors. Embodiments described herein allow for any one of a number of devices configured on a common substrate with different well structures and according to different parameters.

In step 152, Boron (B), Indium (I), or other P-type materials can be used for P-type implants, and arsenic (As), antimony (Sb) or phosphorous (P) and other N-type materials can be used for N-type implants. In certain embodiments, the screening region 112 can have a dopant concentration between about $1\times10^{19}$ to $5\times10^{20}$ dopant atoms/cm$^3$, with the selected dopant concentration dependent on the desired threshold voltage as well as other desired transistor characteristics. A germanium (Ge), carbon (C), or other dopant migration resistant layer can be incorporated above the screening region to reduce upward migration of dopants. The dopant migration resistant layer can be formed by way of ion implantation, in-situ doped epitaxial growth or other process. In certain embodiments, a dopant migration resistant layer can also be incorporated to reduce downward migration of dopants.

In certain embodiments of the DDC transistor, a threshold voltage set region 111 is positioned above the screening region 112. The threshold voltage set region 111 can be either adjacent to, incorporated within or vertically offset from the screening region. In certain embodiments, the threshold voltage set region 111 is formed by delta doping, controlled in-situ deposition, or atomic layer deposition. In alternative embodiments, the threshold voltage set region 111 can be formed by way of controlled outdiffusion of dopant material from the screening region 112 into an undoped epitaxial layer, or by way of a separate implantation into the substrate following formation of the screening region 112, before the undoped epitaxial layer is formed. Setting of the threshold voltage for the transistor is implemented by suitably selecting dopant concentration and thickness of the threshold voltage set region 111, as well as maintaining a separation of the threshold voltage set region 111 from the gate dielectric 128, leaving a substantially undoped channel layer directly adjacent to the gate dielectric 128. In certain embodiments, the threshold voltage set region 111 can have a dopant concentration between about $1 \times 10^{18}$ dopant atoms/cm$^3$ and about $1 \times 10^{19}$ dopant atoms per cm$^3$. In alternative embodiments, the threshold voltage set region 111 can have a dopant concentration that is approximately less than half of the concentration of dopants in the screening region 112.

In certain embodiments, the final layer of the channel is formed above the screening region 112 and threshold voltage set region 111 by way of a blanket or selective EPI deposition (as shown in the alternatives shown in 152A-D), to result in a substantially undoped channel region 110 of a thickness tailored to the technical specifications of the device. As a general matter, the thickness of the substantially undoped channel region 110 ranges from approximately 5-25 nm, with the selected thickness based upon the desired threshold voltage for the transistor. Preferably, a blanket EPI deposition step is performed after forming the screening region 112, and the threshold voltage setting region 111 is formed by controlled outdiffusion of dopants from the screening region 112 into a portion of the blanket EPI layer, as described below. Dopant migration resistant layers of C, Ge, or the like can be utilized as needed to prevent dopant migration from the threshold voltage set region 111 into the substantially undoped channel region 110, or alternatively from the screening region 112 into the threshold voltage set region 111.

In addition to using dopant migration resistant layers, other techniques can be used to reduce upward migration of dopants from the screening region 112 and the threshold voltage set region 111, including but not limited to low temperature processing, selection or substitution of low migration dopants such as antimony or indium, low temperature or flash annealing to reduce interstitial dopant migration, or any other technique to reduce movement of dopant atoms can be used.

As described above, the substantially undoped channel region 110 is positioned above the threshold voltage set region 111. Preferably, the substantially undoped channel region 110 has a dopant concentration less than $5 \times 10^{17}$ dopant atoms per cm$^3$ adjacent or near the gate dielectric 128. In some embodiments, the substantially undoped channel region 110 can have a dopant concentration that is specified to be approximately less than one tenth of the dopant concentration in the screening region 112. In still other embodiments, depending on the transistor characteristics desired, the substantially undoped channel region 110 may contain dopants so that the dopant concentration is elevated to above $5 \times 10^{17}$ dopant atoms per cm$^3$ adjacent or near the gate dielectric 128. Preferably, the substantially undoped channel region 110 remains substantially undoped by avoiding the use of halo or other channel implants.

Referring to FIG. 1B, STI formation 154, which, again, can occur before or after well formation 152, can include a low temperature trench sacrificial oxide (TSOX) liner, which is formed at a temperature lower than 900° C. as shown by 154A. Embodiments that form the STI structures after the blanket EPI deposition step, using a process that remains within a low thermal budget, can reduce dopant migration from the previously formed screening region 112 and threshold voltage setting region 111.

As shown in step 156 (FIG. 1B), the gate stack 108 can be formed or otherwise constructed above the substantially undoped channel region 110 in a number of different ways, from different materials, and of different work functions. One option is a poly/SiON gate stack 156A. Another option is a gate-first process 156B that includes SiON/Metal/Poly and/or SiON/Poly, followed by High-K/Metal Gate. Another option, a gate-last process 156C includes a high-K/metal gate stack wherein the gate stack can either be formed with "Hi-K first-Metal gate last" flow or and "Hi-K last-Metal gate last" flow. Yet another option, 156D is a metal gate that includes a tunable range of work functions depending on the device construction. Preferably, the metal gate materials for NMOS and PMOS are selected to near mid-gap, to take full advantage of the DDC transistor. However, traditional metal gate work function band-gap settings may also be used. In one scheme, metal gate materials can be switched between NMOS and PMOS pairs as a way to attain the desired work functions for given devices.

A gate stack may be formed or otherwise constructed above the substantially undoped channel region 110 in a number of different ways, from different materials including polysilicon and metals to form what is known as "high-k metal gate". The metal gate process flow may be "gate 1$^{st}$" or "gate last". Preferably, the metal gate materials for NMOS and PMOS are selected to near mid-gap, to take full advantage of the DDC transistor. However, traditional metal gate work function band-gap settings may also be used. In one scheme, metal gate materials can be switched between NMOS and PMOS pairs as a way to attain the desired work functions for given devices. Following formation of the gate stack, source/drain portions may be formed. Typically, the extension portions are implanted, followed by additional spacer formation and then implant or, alternatively, selective epitaxial deposition of deep source/drain regions.

In step 158, Source/Drain tips can be implanted. The dimensions of the tips can be varied as required, and will depend in part on whether gate spacers (SPCR) are used. In one embodiment, Source/Drain tips are not formed, and there may be no tip implant.

In step 160, the source 104 and drain 106 can be formed preferably using conventional processes and materials such as ion implantation (160A) and in-situ doped epitaxial deposition (160B). Optionally, as shown in step 160C, PMOS or NMOS selective EPI layers can be formed in the source and drain regions as performance enhancers for strained channels. Source 104 and drain 106 can further include raised and/or recessed source/drains, asymmetrically doped, counter-doped or crystal structure modified source/drains, or implant doping of source/drain extension regions according to LDD (lightly doped drain) techniques, provided that the thermal budget for any anneal steps be within the boundaries of what is required to keep the screening region 112 and threshold voltage setting region 111 substantially intact.

In step 162, a metal gate is formed in accordance with a gate last process. Step 162 is optional and may be performed only for gate-last processes (162A).

Referring to FIG. 1A, the channel 110 contacts and extends between the source 104 and the drain 106, and supports movement of mobile charge carriers between the source and the drain. In operation, when gate electrode voltage is applied to the DDC transistor 100 at a predetermined level, a depletion region formed in the substantially undoped channel 110 can extend to the screening region 112, since channel depletion depth is a function of the integrated charge from dopants in the doped channel lattice, and the substantially undoped channel 110 has very few dopants. The screening region 112, if fabricated according to specification, effectively pins the depletion region to define the depletion zone width.

The threshold voltage in conventional field effect transistors (FETs) can be set by directly implanting a "threshold voltage implant" into the channel, raising the threshold voltage to an acceptable level that reduces transistor off-state leakage while still allowing speedy transistor switching. Alternatively, the threshold voltage ($V_t$) in conventional FETs can also be set by a technique variously known as "halo" implants, high angle implants, or pocket implants. Such implants create a localized, graded dopant distribution near a transistor source and drain that extends a distance into the channel. Halo implants are often required by transistor designers who want to reduce unwanted source/drain leakage conduction or "punch through" current, but have the added advantage of adjusting threshold voltage. Unfortunately halo implants introduce additional process steps, thereby increasing the manufacturing cost. Also, halo implants can introduce additional dopants in random, unwanted locations in the channel. These additional dopants increase the variability of threshold voltage between transistors, and decrease mobility and channel transconductance due to the adverse effects of additional and unwanted dopant scattering centers in the channel. Eliminating or greatly reducing the number of halo implants is desirable for reducing manufacture time and making more reliable wafer processing. By contrast, the techniques for forming the DDC transistor 100 use different threshold voltage setting techniques that do not rely on halo implants (i.e. haloless processing) or channel implants to set the threshold voltage to a desired range. By maintaining a substantially undoped channel near the gate, the DDC transistor further allows for greater channel mobility for electron and hole carriers with improved variation in threshold voltage from device to device.

As will also be appreciated, position, concentration, and thickness of the screening region 112 are important factors in the design of the DDC transistor. In certain embodiments, the screening region is located above the bottom of the source and drain junctions. To dope the screening region so as to cause its peak dopant concentration to define the edge of the depletion width when the transistor is turned on, methods such as delta doping, broad dopant implants, or in-situ doping is preferred, since the screening region 112 should have a finite thickness to enable the screening region 112 to adequately screen the well therebelow while avoiding creating a path for excessive junction leakage. When transistors are configured to have such screening regions, the transistor can simultaneously have good threshold voltage matching, high output resistance, low junction leakage, good short channel effects, and still have an independently controllable body due to a strong body effect. In addition, multiple DDC transistors having different threshold voltages can be easily implemented by customizing the position, thickness, and dopant concentration of the threshold voltage set region 111 and/or the screening region 112 while at the same time achieving a reduction in the threshold voltage variation. In one embodiment, the screening region is positioned such that the top surface of the screening region is located approximately at a distance of Lg/1.5 to Lg/5 below the gate (where Lg is the gate length). In one embodiment, the threshold voltage set region has a dopant concentration that is approximately 1/10 of the screening region dopant concentration. In certain embodiments, the threshold voltage set region is thin so that the combination of the threshold voltage set region and the screening region is located approximately within a distance of Lg/1.5 to Lg/5 below the gate.

Modifying threshold voltage by use of a threshold voltage set region 111 positioned above the screening region 112 and below the substantially undoped channel 110 is an alternative technique to conventional threshold voltage implants for adjusting threshold voltage. Care must be taken to prevent dopant migration into the substantially undoped channel 110, and use of low temperature anneals and anti-migration materials such as carbon or germanium is recommended for many applications. More information about the formation of the threshold voltage set region 111 and the DDC transistor is found in pending U.S. patent application Ser. No. 12/895,785 filed Sep. 30, 2010, published as U.S. Patent Publication 2011/0079861, the entirety of which disclosure is herein incorporated by reference.

Yet another technique for modifying threshold voltage relies on selection of a gate material having a suitable work function. The gate electrode 102 can be formed from conventional materials, preferably including, but not limited to, metals, metal alloys, metal nitrides and metal silicides, as well as laminates thereof and composites thereof. In certain embodiments the gate electrode 102 may also be formed from polysilicon, including, for example, highly doped polysilicon and polysilicon-germanium alloy. Metals or metal alloys may include those containing aluminum, titanium, tantalum, or nitrides thereof, including titanium containing compounds such as titanium nitride. Formation of the gate electrode 102 can include silicide methods, chemical vapor deposition methods and physical vapor deposition methods, such as, but not limited to, evaporative methods and sputtering methods. Typically, the gate electrode 102 has an overall thickness from about 1 to about 500 nanometers. In certain embodiments, metals having a work function intermediate between band edge and mid-gap can be selected. As discussed in pending U.S. patent application Ser. No. 12/960,266 filed Dec. 3, 2010, issued as U.S. Pat. No. 8,569,128, the entirety of which disclosure is herein incorporated by reference, such metal gates simplify swapping of PMOS and NMOS gate metals to allow a reduction in mask steps and different required metal types for systems on a chip or other die supporting multiple transistor types.

Applied bias to the screening region 112 is yet another technique for modifying threshold voltage of the DDC 100. The screening region 112 sets the body effect for the transistor and allows for a higher body effect than is found in conventional FET technologies. For example, a body tap 126 to the screening region 112 of the DDC transistor can be formed in order to provide further control of threshold voltage. The applied bias can be either reverse or forward biased, and can result in significant changes to threshold voltage. Bias can be static or dynamic, and can be applied to isolated transistors, or to groups of transistors that share a common well. Biasing can be static to set threshold voltage at a fixed set point, or dynamic, to adjust to changes in transistor operating conditions or requirements. Various suitable biasing techniques are disclosed in pending U.S. patent application Ser. No. 12/708,497 filed Feb. 18, 2010, and issued U.S. Pat. No. 8,273,617, the entirety of which disclosure is herein incorporated by reference.

Advantageously, DDC transistors created in accordance with the foregoing embodiments, structures, and processes, can have a reduced mismatch arising from scattered or random dopant variations as compared to conventional MOS transistors. In certain embodiments, the reduced variation results from the adoption of structures such as the screening region, the optional threshold voltage set region, and the epitaxially grown channel region. In certain alternative embodiments, mismatch between DDC transistors can be reduced by implanting the screening layer across multiple DDC transistors before the creation of transistor isolation structures, and forming the channel layer as a blanket epitaxial layer that is grown before the creation of transistor epitaxial structures. In certain embodiments, the screening region has a substantially uniform concentration of dopants in a lateral plane. The DDC transistor can be formed using a semiconductor process having a thermal budget that allows for a reasonable throughput while managing the diffusivities of the dopants in the channel. Further examples of transistor structure and manufacture suitable for use in DDC transistors are disclosed in U.S. patent application Ser. No. 12/708,497, filed on Feb. 18, 2010, titled ELECTRONIC DEVICES AND SYSTEMS, AND METHODS FOR MAKING AND USING THE SAME, and issued as U.S. Pat. No. 8,273,617, by Scott E. Thompson et al., as well as U.S. patent application Ser. No. 12/971,884, filed on Dec. 17, 2010 titled Low Power Semiconductor Transistor Structure and Method of Fabrication Thereof, and issued as U.S. Pat. No. 8,530,286, and U.S. patent application Ser. No. 12/971, 955 filed on Dec. 17, 2010 titled Transistor with Threshold Voltage Set Notch and Method of Fabrication Thereof, and issued 8,759,872, the respective contents of which are incorporated by reference herein.

Figure 2:
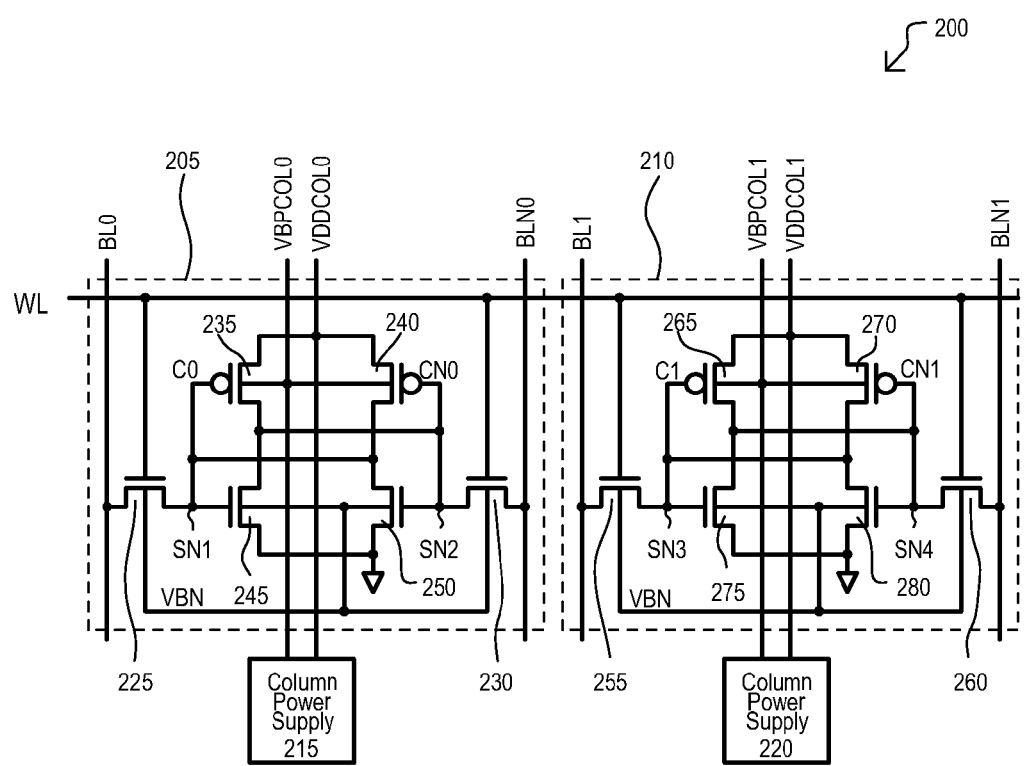
FIG. 2 illustrates an integrated circuit including static random access memory (SRAM) cells in accordance with one embodiment.

Referring initially to FIG. 2, an integrated circuit device according to an embodiment is shown in a block diagram and designated by the general reference character 200. Integrated circuit 200 is a Static Random Access Memory (SRAM) device that may include a number of SRAM cells, including SRAM cells arranged in multiple rows and columns. For ease of discussion, however, only two SRAM cells 205 and 210 are illustrated and discussed along with the associated column power supplies 215 and 220 to generate the applied power supply voltages. The SRAM cells 205 and 210 are implemented using DDC transistors.

In FIG. 2, the SRAM cell 205 includes a pair of pass-gate DDC transistors 225 and 230, a pair of pull-up DDC transistors 235 and 240, and a pair of pull-down DDC transistors 245 and 250. The pass-gate DDC transistors 225 and 230, and the pull-down DDC transistors 245 and 250 are typically NMOS transistors. The pass-gate DDC transistors 225 and 230 couple a pair of data lines BL0 and BLN0, also referred to as "bit lines", to storage nodes SN1 and SN2 respectively, where the voltages at nodes SN1 and SN2 are inversely related. The pull-down DDC transistors 245 and 250 couple a power supply VSS, usually the ground voltage of the circuit, to the storage nodes SN1 and SN2 respectively. The pull-up DDC transistors 235 and 240 are typically PMOS transistors that couple the positive power supply VDDCOL0 to the storage nodes SN1 and SN2 respectively. The substrates of the NMOS transistors are connected to the ground voltage of the circuit, and the substrates for the PMOS transistors are connected to a power supply voltage VBPCOL0. SRAM cell 210 is similar, and includes a pair of pass-gate DDC transistors 255 and 260, a pair of pull-up DDC transistors 265 and 270, a pair of pull-down DDC transistors 275 and 280, storage nodes SN3 and SN4, bit lines BL1 and BLN1, and power supplies VDDCOL1 and VBPCOL1.

In FIG. 2 each column of the SRAM 200 includes a column power supply block that supplies the power supply voltage for the corresponding column. The column power supply block 215 supplies the power supply voltage VDDCOL0 and body bias voltage VBPCOL0, and the column power supply block 220 supplies the power supply voltage VDDCOL1 and body bias voltage VBPCOL1. Each column power supply block independently controls the power supply voltage and PMOS pull-up transistor body bias voltage supplied to each column such that each column can receive different power supply and body bias voltages. In addition, the column power supply block can provide different power supply voltages and body bias voltages to the same column at different times, or during different modes of operation. For example, as described in more detail below, the column power supply block can supply different power supply voltages and/or body bias voltages to the corresponding column during read and write operations.

The SRAM cell shown in FIG. 2 can retain its state indefinitely as long as the supplied power is sufficient to operate the cell correctly. The SRAM cell 205 includes two cross-coupled inverters formed of the pair of transistors 235 and 245, and 240 and 250. The two inverters operate to reinforce the stored charge on storage nodes SN1 and SN2 continuously, such that the voltages at each of the two storage nodes are inverted with respect to one another. When SN1 is at a logical "1", usually a high voltage, SN2 is at a logical "0", usually a low voltage, and vice versa.

Referring to FIG. 2, a write operation can be performed to store data in a selected SRAM cell, and a read operation can be performed to access stored data in a selected SRAM cell. In one embodiment, data is stored in a selected SRAM cell, e.g. SRAM cell 205, during a write operation by placing complementary write data signals on the two bit lines BL0 and BLN0, and placing a positive voltage VWL on the word line WL connected to the gate of the pass-gate transistors 225 and 230, such that the two bit lines are coupled to the storage nodes SN1 and SN2, respectively. The write operation is successful when the write data signals on the two bit lines overcome the voltages on the two storage nodes and modify the state of the SRAM cell. The cell write is primarily due to the bit line driven low overpowering the PMOS pull-up transistor via the pass-gate transistor. Thus the relative strength ratio of the NMOS pass-gate transistor to the PMOS pull-up transistor is important to maximizing the write margin. Data is accessed from a selected SRAM cell, e.g. SRAM cell 205, during a read operation by placing a positive voltage VWL on the word line WL such that the pass-gate transistors 225 and 230 allow the storage nodes SN1 and SN2 to be coupled to the bit lines BL0 and BLN0 respectively. During the read operation the SRAM cell 205 drives complementary read data signals onto the bit lines BL0 and BLN0. The differential voltage on the bit lines BL0 and BLN0 can be sensed using a differential sense amplifier (not shown) that senses and amplifies the differential voltage signal on the bit lines. The output of the sense amplifier is subsequently output as the read data for the selected SRAM cell.

In one embodiment, during the write operation for selected SRAM cell 205 in FIG. 2, the column power supply control 215 places a high reverse body bias voltage on VBPCOL0 and a normal power supply voltage VDD on VDDCOL0, thereby applying a reverse body bias to the PMOS pull-up transistors 235 and 240 and reducing their leakage and drive current. For example, a power supply voltage (VDD) of 1 Volt is placed on the column power supply node VDDCOL0, and a reverse body bias voltage of 1.25 Volts is placed on the body bias control node VBPCOL0. Typically, VWL is VDD. During the read operation, the column power supply control 215 places a boosted power supply voltage 1.25 Volts on VDDCOL0, thereby reducing the difference between the voltages applied to the substrate and the source of the PMOS pull-up transistors 235 and 240. Therefore, the reverse bias applied to the PMOS pull-up transistors 235 and 240 during the read operation is lower than the reverse bias applied during the write operation. Since the PMOS pull-up transistors have an enhanced body coefficient, the reduction in reverse bias results in an increased current drive capability for these transistors. Therefore, the PMOS pull-up transistors 235 and 240 have a higher current drive capability during the read operation as compared to the write operation. The higher current drive capability of the PMOS pull-up transistor during read operations results in an increase in the read SNM, and therefore, an increase in cell stability for the SRAM cell 205. In addition, the write SNM that can be lower than the read SNM, and therefore, the SRAM cell 205 has reduced stability during the write operation which facilitates writing. Reduced write SNM due to a weaker PMOS transistor can translate directly to increased write margin.

Referring to the SRAM cell 205 in FIG. 2, in an alternative embodiment, the column power supply control block 215 places a lower body bias voltage VDD on VBPCOL0. In addition, the column power supply control 215 places a normal power supply voltage VDD on VDDCOL0 during the write operation, and a boosted power supply voltage on VDDCOL0 during the read operation. Typically VDD is 1 Volt and the boosted power supply voltage is 1.25 Volts. Therefore, a zero body bias voltage is applied to the PMOS pull-up transistors 235 and 240 during the write operation, and a forward body bias voltage is applied to the PMOS pull-up transistors during the read operation. As a result of the enhanced body coefficient, the PMOS pull-up transistors 235 and 240 have a higher current drive capability during the read operation as compared to the write operation. The higher current drive capability during read operations results in an increase in the read SNM, and therefore, an increase in stability for the SRAM cell 205. In addition, the write SNM that can be lower than the read SNM, and therefore, the SRAM cell 205 has reduced stability during the write operation. Other embodiments may apply PMOS reverse body bias during standby or write operations and forward body bias during read operations by driving appropriate voltages on VBPCOL0, VDDCOL0, or both.

It is noted that the SRAM 200 can include a plurality of word lines and bit lines, even though only one word line and two sets of bit lines have been shown in FIG. 2. Therefore, even though only two SRAM cells 205 and 210 are shown in FIG. 2, other SRAM cells (not shown) can be placed at intersections of the plurality of word lines and bit lines. In some embodiments, the SRAM 200 can have 8, 16, 32, 64, 128 or more columns that can be arranged in word widths of 8, 16, 32, 64, 128, 256, or more cells. In some embodiments, each column of the SRAM 200 can have an associated column power supply block that independently controls the column power supply voltages provided to the corresponding column. In alternative embodiments, each column of the SRAM 200 can be sub-divided into column sub-groups, where each column sub-group has an associated column power supply block that independently controls the column power supply voltages provided to corresponding column subgroup. In certain other embodiments, one column power supply block can be associated with more than one column or column subgroup. In addition, power supply and body bias voltages other than the ones described above may be applied to the SRAM cells of SRAM 200 during read and write operations. Such power supply voltages can be selected based on the design of the SRAM cell, and the electrical characteristics of the DDC transistors used in the SRAM cell.

Further embodiments of the SRAM 200 can sub-divide the constituent SRAM cells into multiple groups, where each group includes a plurality of SRAM cells in a row direction and a plurality of SRAM cells in a column direction. Each group can also include a biasing network that couples a power supply block associated with the group to the power supply voltage connections and/or the body bias voltage connections of the SRAM cells in the group, and is not coupled to the other groups. Thus, the power supply voltage and/or the body bias voltage for each group can be independently selected. In one embodiment, the power supply block generates different power supply and/or body bias voltages for each group depending on whether at least one SRAM cell in the group is being accessed for a read operation (read mode), or at least one SRAM cell in the group is being accessed for a write operation (write mode), or none of the SRAM cells in the group are being accessed for either read or write operation (standby mode). Therefore, at a particular time, the power supply blocks associated with the groups of SRAM cells can be configured as one or more rows or groups of SRAM cells to operate in a read mode while configuring the other groups of SRAM cells in the SRAM 200 to operate in a standby mode of operation, as determined by the memory address and read/write control signals received by the SRAM 200. In an alternative embodiment, the power supply block generates different power supply and/or body bias voltages for each column of the group depending on whether at least one SRAM cell in the column of the group is being accessed for a read operation (read mode), or at least one SRAM cell in the column of the group is being accessed for a write operation (write mode), or none of the SRAM cells in the group are being accessed for either read or write operation (standby mode). At a particular time, the power supply blocks can select one value of body bias voltage for a column of the group that is being accessed for a write operation (i.e., at least one SRAM cell in the column is being accessed for a write operation), and a different value of body bias voltage for other columns in the group that not being accessed for a write operation. Similarly, the power supply blocks can select one value of power supply voltage for a column of the group that is being accessed for a write operation, and a different value of body bias voltage for other columns in the group that not being accessed for a write operation. The values of the body bias voltage and the power supply voltage for each column of the group can be selected independently of each other.

Figure 3:
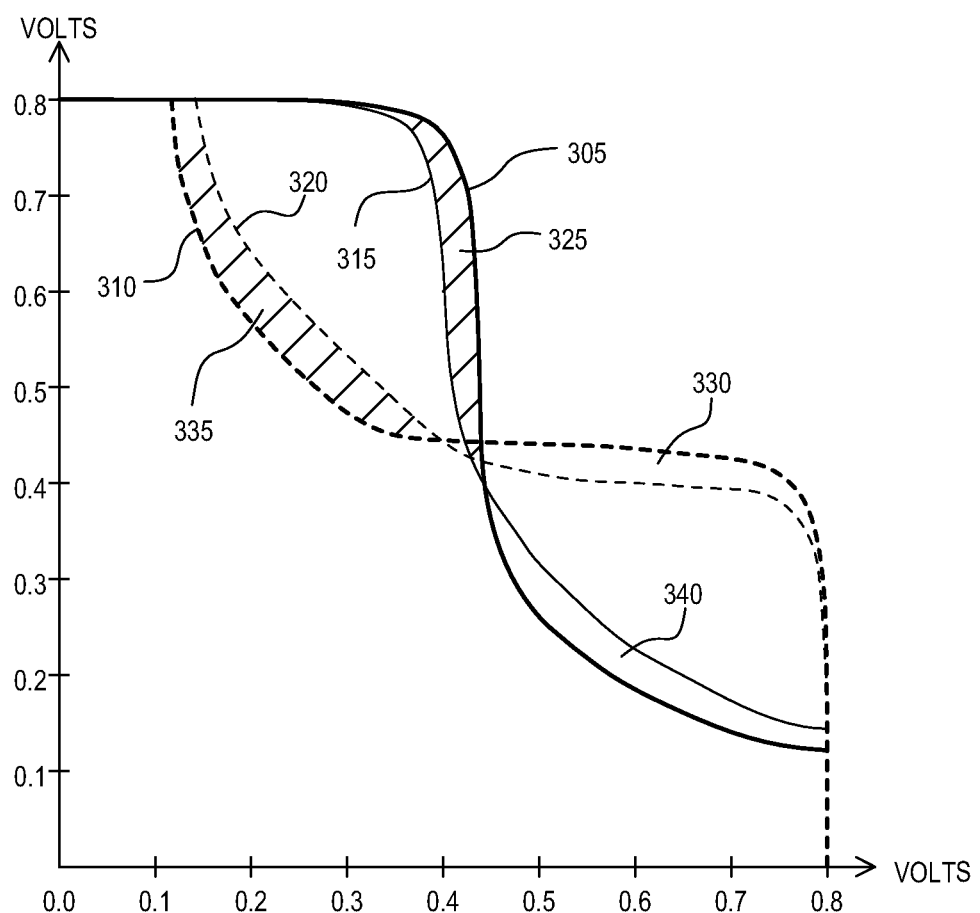
FIG. 3 illustrates butterfly curves and read static noise margins for SRAM cells using DDC transistors, and for SRAM cells using conventional transistors.

FIG. 3 illustrates butterfly curves and read SNMs for SRAM cells using DDC transistors, and for SRAM cells using conventional transistors. The butterfly curves shown in FIG. 3 are obtained from SPICE simulations performed for SRAM cells using 65 nm technology node DDC transistors, and for SRAM cells using 65 nm technology node conventional transistors. These butterfly curves are only provided as an example. Similar butterfly curves can be obtained from SPICE simulations performed for SRAM cells using DDC transistors and SRAM cells using conventional transistors that are fabricated using other technology nodes, e.g., 40 nm, 28 nm, etc. Each butterfly curve consists of two voltage transfer curves, where one of the voltage transfer curve corresponds to one of the inverters in the SRAM cell, and the other voltage transfer curve is the result of taking the first voltage transfer curve and flipping it and rotating it by 90 degrees. The two voltage transfer curves 305 and 310 together represent the butterfly curve for an SRAM cell implemented using DDC transistors. Similarly, the two voltage transfer curves 315 and 320 together represent the butterfly curve for an SRAM cell implemented using conventional transistors. The SRAM cells associated with the two butterfly curves in FIG. 3 differ with regard to the type of transistor used in the SRAM cell, i.e., DDC transistor vs. conventional transistor, but are otherwise identical in all respects, such as transistor sizes for the transistors used in the cells and the voltages applied by the column power supply during read and write operations. The butterfly curves in FIG. 3 are obtained for voltages applied during read operations, such that VDDCOL0 is 0.8 Volts, and VBPCOL0 is 0.6 Volts.

Referring to FIG. 3, the read SNM is the length of a side of a largest square that can be drawn between the two voltage transfer curves that are part of the butterfly curve. Therefore, a larger opening between the two voltage transfer curves, i.e., a larger eye in the butterfly curve indicates increased read SNM and increased cell stability of the SRAM cell. Regions 325 and 330 of the butterfly curve represent the increase in cell stability for the SRAM cell using DDC transistors resulting from the enhanced body coefficient of the PMOS pull-up transistors when the VDD and VBP is varied as described. The increased body effect can raise or lower the threshold voltage of the NMOS pass-gate transistor when the stored low voltage in the cell rises, weakening the NMOS pass-gate transistor with respect to the NMOS pull-down transistor and providing a more favorable strength ratio during read operations. Similarly, regions 335 and 340 of the butterfly curves represent the increase in cell stability for the SRAM cell using DDC transistors resulting from the enhanced body coefficient of the NMOS pull-down and pass-gate transistors. Therefore, the SRAM cell using DDC transistors has increased cell stability because of the increased stability resulting from regions 325, 330, 335, and 340. The read SNM for the SRAM cell using DDC transistors is 186 millivolts, and the read SNM for the SRAM cell using conventional transistors is 132 millivolts, as measured from the simulation results illustrated in FIG. 3. Similar curves may be obtained by experimental measurements of fabricated SRAM cells that are properly instrumented, i.e., have probe points on the internal cell nodes. In general, calibrated simulations are used to determine margins by simulation as is done here.

Figure 4:
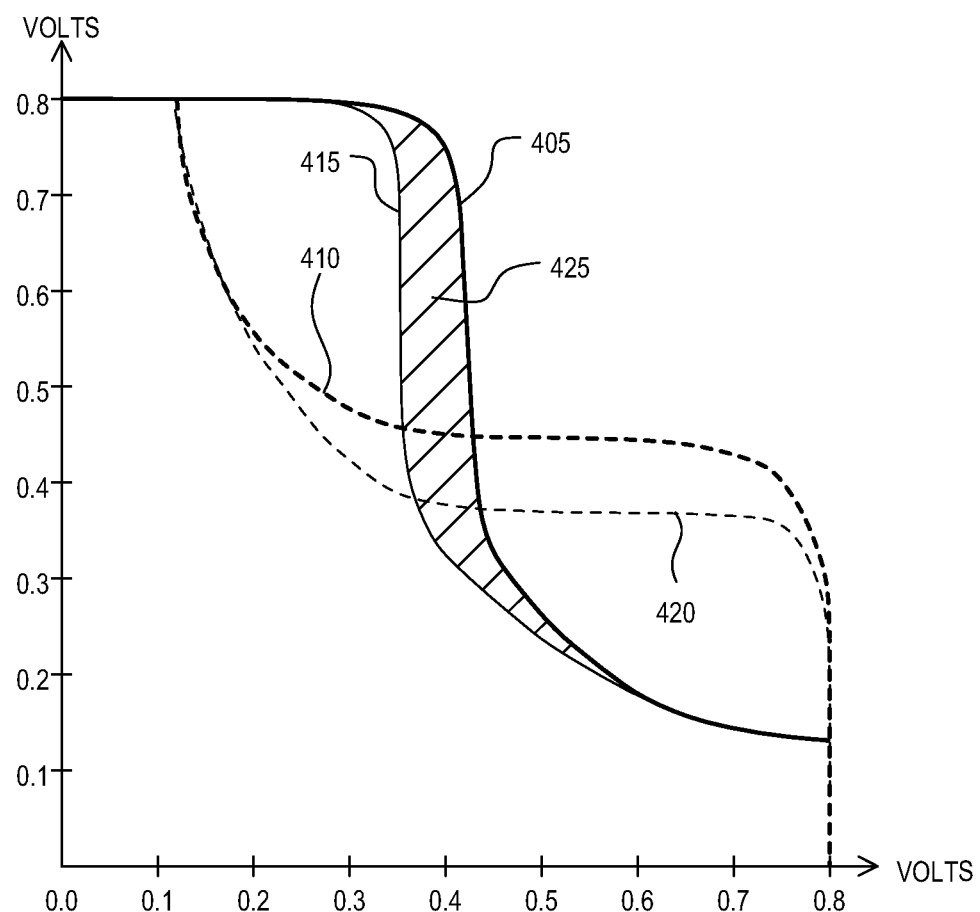
FIG. 4 illustrates butterfly curves showing read SNM and write SNM for SRAM cells using DDC transistors.

FIG. 4 shows butterfly curves illustrating that by driving the appropriate combination of VDDCOL and VBPCOL the read SNM can be greater than the SNM during write (an indicator of better write margin) for an SRAM cell using DDC transistors. The butterfly curves shown in FIG. 4 are obtained from SPICE simulations performed for SRAM cells using 65 nm technology node DDC transistors. These butterfly curves are only provided as an example. Similar butterfly curves can be obtained from SPICE simulations performed for SRAM cells using DDC transistors that are fabricated using other technology nodes, e.g., 40 nm, 28 nm, etc. The two voltage transfer curves 405 and 410, obtained from SPICE simulations, together represent a read butterfly curve that shows the voltage transfer characteristics of an SRAM cell implemented using DDC transistors during the read operation. Similarly, the two voltage transfer curves 415 and 420, obtained from SPICE simulations, together represent a write butterfly curve that shows the voltage transfer characteristics of an SRAM cell implemented using DDC transistors during the write operation. The SRAM cells associated with the two butterfly curves in FIG. 4 differ with regard to the body bias voltage applied to the PMOS pull-up transistor used in the SRAM cell, but are otherwise identical in all respects, such as transistor sizes and the power supply voltage applied to the PMOS pull-up transistor. The body bias voltage applied to the PMOS pull-up transistors during a read operation is sufficient to operate these transistors under forward body bias, while the body bias voltage applied to the PMOS pull-up transistors during write operations is sufficient to operate these transistors under reverse body bias. For the simulations in FIG. 4, the power supply voltage is 0.8 Volts, and the forward body bias voltage applied to the PMOS pull-up transistor is 0.25 Volts, i.e., VBPCOL0 is 0.55 Volts for read operations and the reverse body bias voltage is 0.25 Volts, i.e., VBPCOL0 is 1.05 Volts for write operations.

Referring to FIG. 4, the read SNM is the length of a side of a largest square that can be drawn between the two voltage transfer curves that are part of the read butterfly curve. Therefore, a larger opening between the two voltage transfer curves, i.e., a larger eye in the butterfly curve indicates increased read SNM and increased read stability of the SRAM cell. Region 425 of the butterfly curve shows that the read stability of the SRAM cell is higher than the write stability as a result of the enhanced body coefficient of the PMOS pull-up transistors and appropriate PMOS transistor biasing in the read and write operations. The read SNM for the SRAM cell using DDC transistors is 189 millivolts, and the SNM during write, an indicator of write margin, is 143 millivolts, as measured from the simulations results illustrated in FIG. 4. Therefore, the enhanced body coefficient of the DDC transistors results in an increase in the read SNM, and simultaneously results in an increased write margin, as indicated by a decrease in the SNM during a write. This provides an SRAM cell that has a higher cell stability during read operations (because of the higher read SNM), and at the same time, is easier to write to (because the lower SNM during a write results in a cell that is less stable for write operations).

Figure 5:
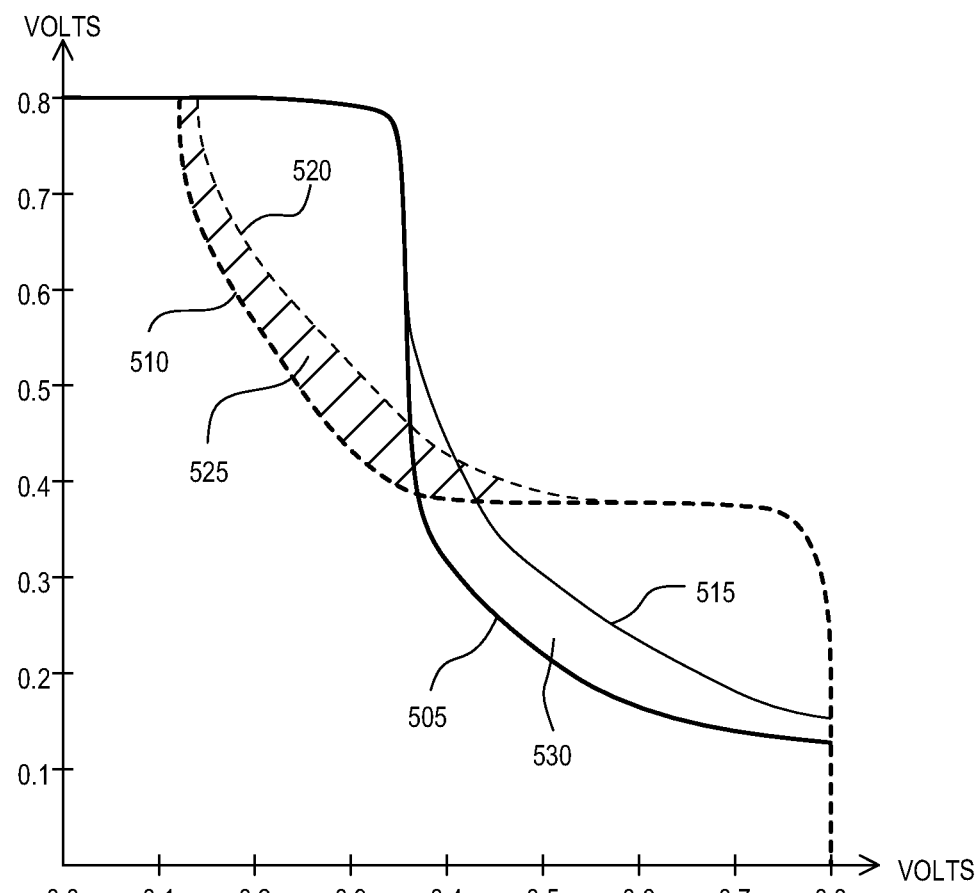
FIG. 5 illustrates butterfly curves showing an increase in read SNM resulting from the enhanced body coefficient of the NMOS DDC transistors.

FIG. 5 shows butterfly curves illustrating the increase in the read SNM resulting from the enhanced body coefficient of the NMOS DDC transistors for an SRAM cell. The voltage transfer curves 515 and 520 are obtained from SPICE simulations performed for an SRAM cell implemented with conventional transistors that have a low body coefficient. The voltage transfer curves 505 and 510 are obtained from SPICE simulations performed for an SRAM cell that uses conventional (low body coefficient) PMOS pull-up transistors, and DDC transistors with enhanced body coefficient for the NMOS pass-gate and pull-down transistors. In addition, the same body bias voltage is applied to the PMOS pull-up transistor for each of the voltage transfer curves 505-520. The butterfly curves shown in FIG. 5 are obtained from SPICE simulations performed for SRAM cells using 65 nm technology node DDC transistors and 65 nm technology node conventional transistors. These butterfly curves are only provided as an example. Similar butterfly curves can be obtained from SPICE simulations performed for SRAM cells using DDC transistors and conventional transistors that are fabricated using other technology nodes, e.g., 40 nm, 28 nm, etc.

In FIG. 5, the voltage transfer curves 505 and 510 together represent a butterfly curve that shows the voltage transfer characteristics of an SRAM cell implemented using DDC NMOS transistors. Similarly, the two voltage transfer curves 515 and 520 together represent a butterfly curve that shows the voltage transfer characteristics of an SRAM cell implemented using conventional (low body coefficient) pull-up transistors, and conventional (low body coefficient) NMOS pass-gate and pull-down transistors. The SRAM cells associated with the two butterfly curves in FIG. 5 differ with regard to the type of the NMOS transistors used in the cell, i.e., conventional (low body coefficient) vs. DDC (high body coefficient), but are otherwise identical in all respects, such as transistor sizes, NMOS transistor body bias voltages, and the power supply voltages applied by the column power supply. The butterfly curves in FIG. 5 are obtained for voltages applied during read operations, such that VDDCOL0 is 0.8 Volts, and VBPCOL0 is 0.8 Volts.

Referring to FIG. 5, the SNM for the SRAM cell using DDC transistors is the length of a side of a largest square that can be drawn between the two voltage transfer curves that are part of the read butterfly curve. Therefore, a larger opening between the two voltage transfer curves, i.e., a larger eye in the butterfly curve indicates increased read SNM and increased read stability of the SRAM cell. Regions 525 and 530 of the butterfly curve show that the stability of the SRAM cell using DDC NMOS transistors (having enhanced body coefficient) is higher than the stability of the SRAM cell using conventional (low body coefficient) NMOS transistors as a result of the enhanced body coefficient of the NMOS DDC transistors. The read SNM for the SRAM cell using NMOS DDC transistors is 142 millivolts, and the read SNM for the SRAM cell using conventional NMOS transistors is 111 millivolts, as measured from the simulations results illustrated in FIG. 5. Unlike the PMOS case, the body bias on the pass gate NMOS devices is provided naturally by the SRAM operation. As the read current flows through the series connection of the pass gate and pull down, the low stored voltage rises due to the voltage divider created by the series devices. Thus, node SN1 rises, producing body bias on transistor 225, which reduces the strength of 225, making the cell more stable in read. The improved body coefficient of the DDC transistor thus produces a negative feedback effect that increases as the cell goes unstable at low voltages, i.e., when node SN1 rises towards the cell flip point in a read.

Figure 6:
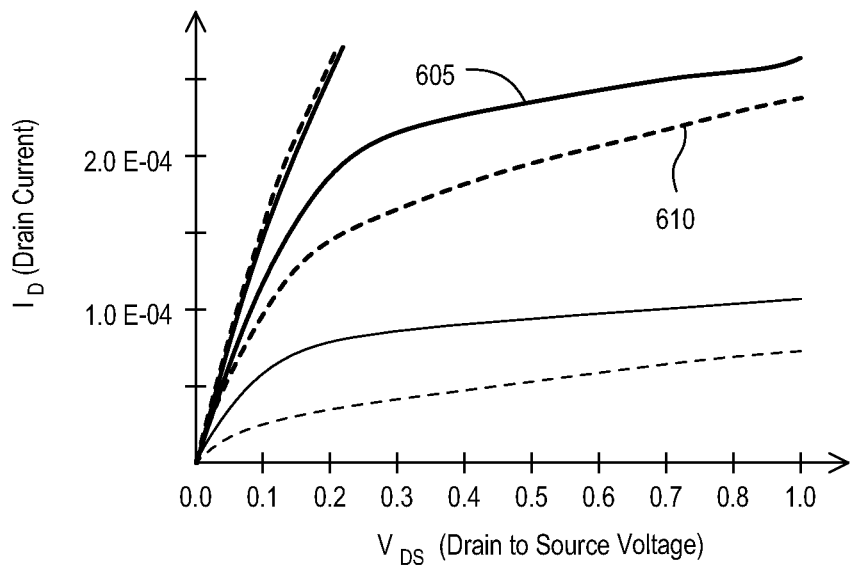
FIG. 6 illustrates the drain current as a function of the drain voltage for a DDC transistor and a conventional transistor.

The DDC transistors also exhibit a higher current drive as compared to conventional transistors, when a low voltage is being applied to the gate and the drain to source voltage is less than $V_{GS}$-$V_T$ of the transistor, i.e., such that the transistor is operating in the linear mode. FIG. 6 shows the drain current as a function of the drain voltage for a DDC transistor, curve 605, and a conventional transistor, curve 610. As shown in FIG. 6, the DDC transistor drain current is 1.5-2 times the drain current of the conventional transistor when the transistor is operating in the linear mode and reduced $V_{GS}$, which may occur due to the circuit operating at reduced VDD. The drain to source voltage on NMOS pull-down transistors of the SRAM cell is low during a read operation as it is obtained from the resistor divider ratio between the pull-down and the pass-gate transistors when the word line WL and the bit line BL are both at a high voltage level VDD. Therefore, these transistors operate in the linear region during a read operation. Typically, the drain to source voltage for the NMOS pull-down transistor can be approximately 0.1 Volts. The NMOS pass-gate transistor connected to the NMOS pull-down transistor is operating is in saturation during the signal generation portion of the read operation, and therefore, does not benefit from this enhanced current drive capability. However, the NMOS pass-gate transistor has an increased body bias voltage that results from the rise in the storage node voltage during the read operation. Therefore, the enhanced body coefficient of the DDC transistor results in a NMOS pass-gate transistor with reduced current drive capability. The combination of the enhanced drive capability of the pull down transistor, and the reduced drive capability of the pass-gate transistor result in an increased read SNM and increased cell stability. This is evident qualitatively by the better voltage divider ratio obtained by weakening the pass-gate and strengthening the pull-down NMOS transistors, respectively. The increase in the read SNM and cell stability can be determined from butterfly curves obtained from SPICE simulations of the SRAM cell using DDC transistors, as described in the discussion corresponding to FIG. 5.

As discussed above, DDC transistors having a screening region have enhanced threshold voltage matching, in addition to having an enhanced body coefficient. Therefore, SRAMs using DDC transistors have reduced threshold voltage variations between the transistors used in different cells of the SRAM, as well as between the transistors used within a particular SRAM cell. An SRAM cell using DDC transistors also has increased read SNM and cell stability as a result of the reduced threshold voltage variations. Reduction of threshold voltage variation between the pass-gate transistors and the pull-down transistors within an SRAM cell contributes in part to the increase in read SNM. In addition, reduction in the threshold voltage variations of PMOS transistors in SRAM cells also contributes to the increase in read SNM, as well as less variability in write margin, i.e., an increase in worst-case as fabricated write margin.

Figure 7A:
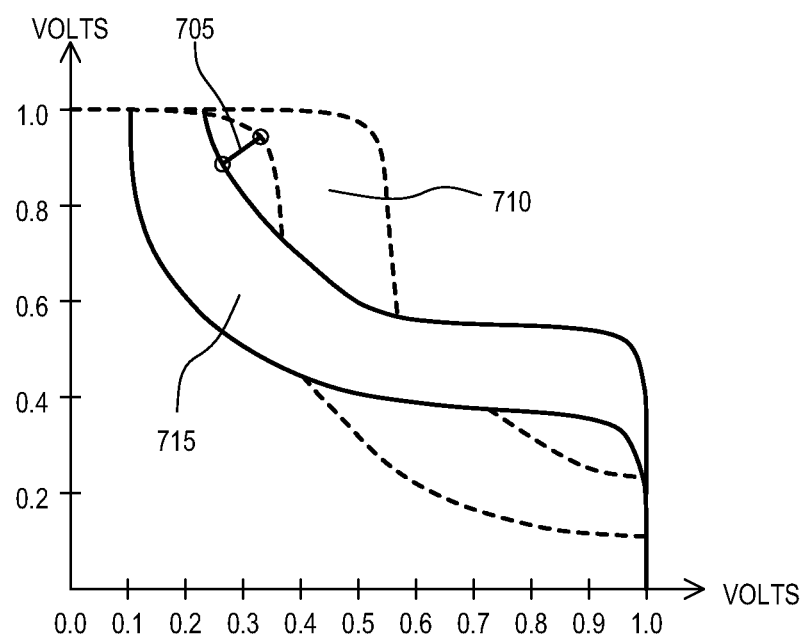
FIG. 7A illustrates butterfly curves for an SRAM cell using conventional transistors in the presence of threshold voltage variations.

FIG. 7A shows butterfly curves illustrating the read SNM for an SRAM cell using conventional transistors in the presence of the threshold voltage variations that can normally occur when the integrated circuit is fabricated. The voltage transfer curve families 710 and 715 that together make up the butterfly curves in FIG. 7A are obtained from Monte Carlo simulations performed for an SRAM cell that uses conventional PMOS and NMOS transistors having a low body coefficient. The butterfly curves in FIG. 7A show the results obtained from 4000 Monte Carlo trials performed under read operating conditions, where the word line voltage VWL is at VDD, the bit line voltages BL0 and BLN0 are at VDD and the pull-up power supply voltage VDDCOL0 is at VDD. VDD is set to 1 Volt for these simulations. In addition, no body bias in applied to the transistors in the SRAM cell for these simulations. The resulting butterfly curves show the variations in SNM that can be caused by the threshold voltage variations of transistors in 4000 SRAM cells. The resulting SNM is the worst-case SNM obtained by determining the largest box that fits between the butterfly curves. The largest diagonal that fits within the eye of butterfly curves determines the largest box that can fit, represented by diagonal line 705, and the dimensions of the sides of the square corresponding to the largest diagonal is the SNM in Volts. The SNM for the SRAM cell using conventional transistors simulated in FIG. 7A, as measured from the Monte Carlo simulations, is 92 mV.

Figure 7B:
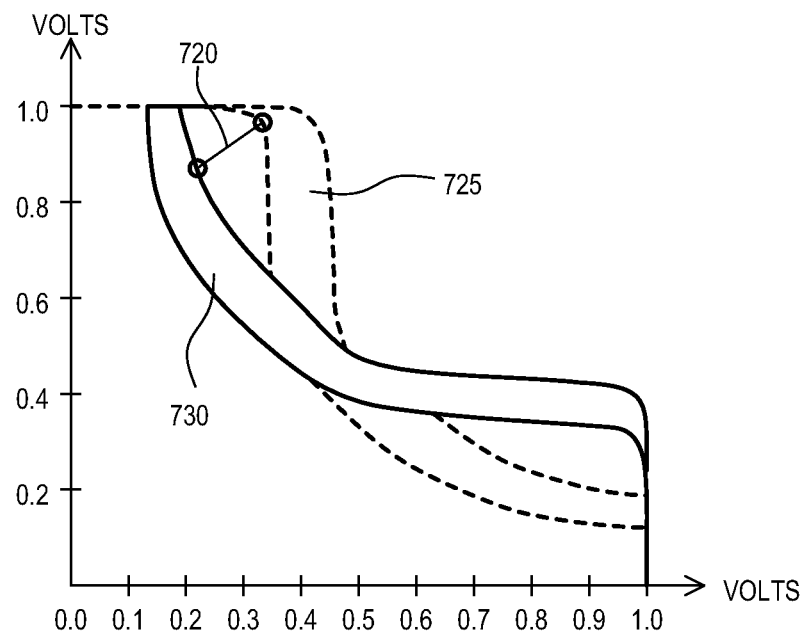
FIG. 7B illustrates butterfly curves for an SRAM cell using DDC transistors in the presence of threshold voltage variations.

FIG. 7B shows butterfly curves illustrating the read SNM for a SRAM cell using DDC transistors in the presence of the threshold voltage variations that will occur in the DDC transistors during integrated circuit fabrication. The voltage transfer curve families 725 and 730 that together make up the butterfly curves in FIG. 7B are obtained from Monte Carlo simulations performed for an SRAM cell that uses DDC PMOS and NMOS transistors having an enhanced body coefficient. As described above the DDC transistors also have reduced threshold voltage variations. The butterfly curves in FIG. 7B show the results obtained from 4000 Monte Carlo trials performed under read operating conditions, where the word line voltage VWL is at VDD, the bit line voltage BL0 and BLN0 is at VDD, the pull-up power supply voltage VDDCOL0 is at VDD. VDD is set to 1 volt for these simulations. In addition, no body bias in applied to the DDC transistors in the SRAM cell for these simulations. The DDC transistors used for the simulations in FIG. 7B have a $\sigma V_T$ that is half of the conventional transistors used for the simulation in FIG. 7A, i.e., the DDC transistors corresponding to the simulations in FIG. 7B have a threshold voltage variation that is half that of the conventional transistors corresponding to the simulations in FIG. 7A. This reflects the improved variability of the DDC transistors due the improved DDC structure and the order of fabrication steps. The resulting butterfly curves show the variations in SNM that can be caused by the threshold voltage variations of transistors in 4000 SRAM cells. The resulting SNM is determined by the largest box that fits between the eye of the butterfly curves, represented by diagonal line 720, and the dimensions of the sides of the square corresponding to the largest diagonal is the SNM in Volts. The SNM for the SRAM cell simulated in FIG. 7B, as measured from the Monte Carlo simulations, is 127 mV.

The Monte Carlo simulations of FIG. 7A and FIG. 7B show that the SNM of the SRAM cell using DDC transistors is higher than the SNM of the SRAM cell using conventional transistors as a result of the reduced threshold voltage variations. Therefore, the SRAM cell using DDC transistors has greater cell stability as a result of the reduced threshold voltage variations. The increased SNM and cell stability for the SRAM cell using DDC transistors can be measured from the butterfly curves obtained as a result of simulations performed for the SRAM cell.

Figure 8A:
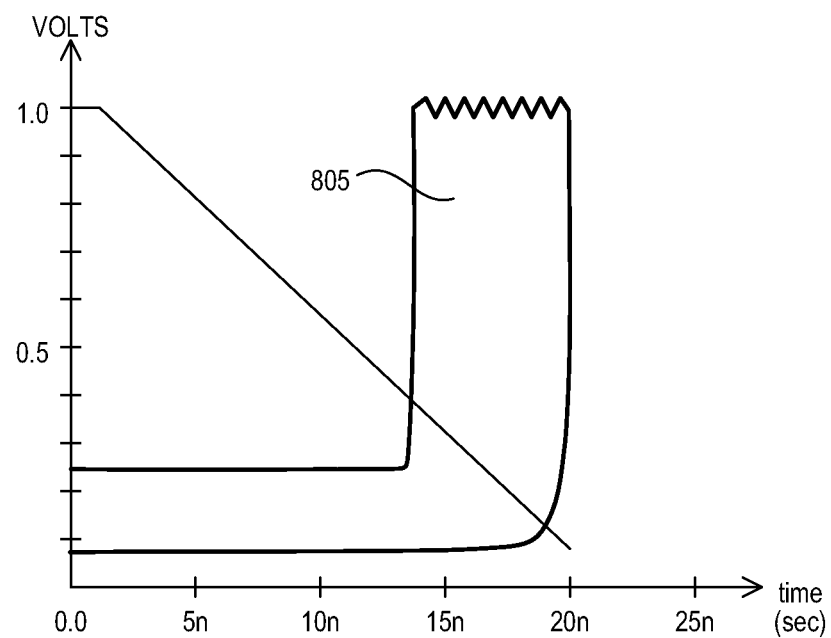
FIG. 8A illustrates the write margin for an SRAM cell using conventional transistors in the presence of threshold voltage variations.

FIG. 8A shows the write margin for an SRAM cell using conventional transistors in the presence of as-fabricated threshold voltage variations. The write margin is defined as the minimum potential on the bit line, e.g., bit line BL0, which is required to invert the state of the SRAM cell when the bit line is driven slowly or swept down from VDD, i.e., the precharge voltage applied to the SRAM bit line, to VSS. Therefore, a higher write margin indicates that the SRAM cell is easier to write to because the state of the SRAM cell is inverted at a higher bit line voltage. The voltage response curves 805 shown in FIG. 8A are obtained from Monte Carlo simulations performed for an SRAM cell that uses conventional PMOS and NMOS transistors having conventional threshold voltage variability. The voltage response curves show the state of a storage node in the SRAM cell as the bit line voltage is swept from VDD to VSS. The voltage response curves in FIG. 8A show the results obtained from 4000 Monte Carlo trials performed under write operating conditions, where the word line voltage VWL is at VDD, the bit line voltage BLN0 is at VDD, the bit line voltage BL0 is slowly reduced to 0 volts, the pull-up power supply voltage VDDCOL0 is at VDD. VDD is set to 1 volt for these simulations. In addition, no body bias in applied to the transistors in the SRAM cell for these simulations. The resulting voltage response curves show the variations in write margin that can be caused by the threshold voltage variations of transistors in 4000 SRAM cells, by monitoring the cell storage node. The resulting write margin is the worst-case write margin obtained in the presence of the threshold voltage variations. The write margin for the SRAM cell using conventional transistors, as measured from the Monte Carlo simulations, is 52 mV.

Figure 8B:
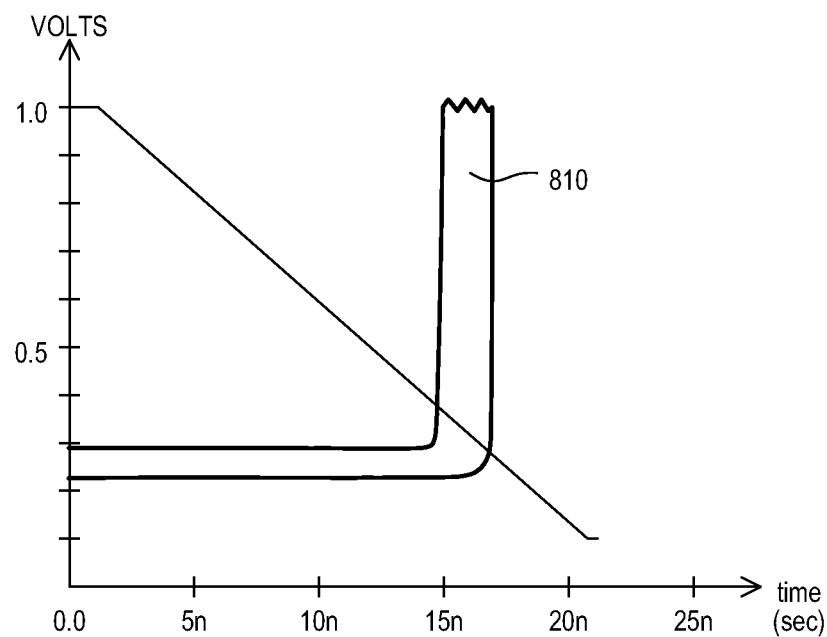
FIG. 8B illustrates the write margin for an SRAM cell using DDC transistors in the presence of threshold voltage variations.

FIG. 8B shows the write margin for an SRAM cell using DDC transistors in the presence of threshold voltage variations. The voltage response curves 810 shown in FIG. 8B are obtained from Monte Carlo simulations performed for an SRAM cell that uses DDC PMOS and NMOS transistors having an enhanced body coefficient. As described above the DDC transistors have reduced threshold voltage variations. The voltage response curves in FIG. 8B show the results obtained from 4000 Monte Carlo trials performed under write operating conditions, where the word line voltage VWL is at VDD, the bit line voltage BLN0 is at VDD, the bit line voltage BL0 is slowly reduced to 0 volts, and the pull-up power supply voltage VDDCOL0 is at VDD. VDD is set to 1 volt for these simulations. In addition, no body bias in applied to the DDC transistors in the SRAM cell for these simulations. The DDC transistors used for the simulations in FIG. 8B have a $\sigma V_T$ that is half of the conventional transistors used for the simulation in FIG. 8A, i.e., the DDC transistors corresponding to the simulations in FIG. 8B have a threshold voltage variation that is half that of the conventional transistors corresponding to the simulations in FIG. 8A. The resulting voltage response curves show the variations in write margin that can result from the threshold voltage variations of transistors in 4000 SRAM cells. The resulting write margin is the worst-case write margin obtained in the presence of the threshold voltage variations. The write margin for the SRAM cell using DDC transistors, as measured from the Monte Carlo simulations, is 190 mV.

Therefore, the Monte Carlo simulations of FIG. 8A and FIG. 8B show that the write margin of the SRAM cell using DDC transistors is greater than the write margin of the SRAM cell using conventional transistors as a result of the reduced threshold voltage variations. The increased write margin for the SRAM cell using DDC transistors can be measured from the voltage response curves obtained as a result of simulations performed for the SRAM cell. Note that the higher write margin is obtained simultaneously with the higher read SNM shown above, without body bias changes. As shown previously, both read SNM and write margin can be further improved by appropriate manipulation of the body biases during read and write operations.

Figure 9A:
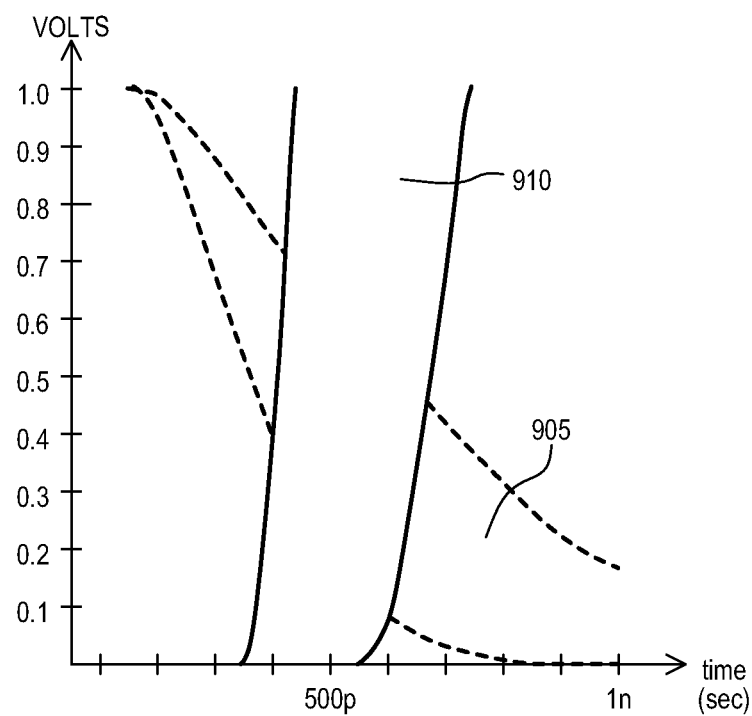
FIG. 9A illustrates bit line speed of an SRAM cell using conventional transistors in the presence of threshold voltage variations.

FIG. 9A shows simulation results for determining the read speed for an SRAM cell using conventional transistors in the presence of threshold voltage variations. The read speed can be primarily due to the bit line slew rate as a bit line voltage transition is triggered by a rising edge of the word line voltage. FIG. 9A shows the results obtained from Monte Carlo simulations using 4000 trials performed under read operating conditions, where the word line voltage VWL is VDD, the bit lines are initially precharged to VDD, and the pull-up power supply voltage is VDD. In addition, VDD is set to 1 Volt, and no body bias is applied to the transistors in the SRAM cell for these simulations. The simulation results show the bit line transition, represented by the group of falling lines 905, which are triggered by the rising edge of the voltage on the word line. The group of rising lines 910 represents the output of an inverter sense amplifier whose input is driven by the falling bit line. The resulting read speed is the worst case read speed obtained in the presence of the threshold voltage variations. The worst-case read speed for the SRAM cell using conventional transistors, as measured from the Monte Carlo simulations, is 530 picoseconds. The worst-case timing sets the speed of the integrated circuit, since it is directly impacted by the SRAM access time.

Figure 9B:
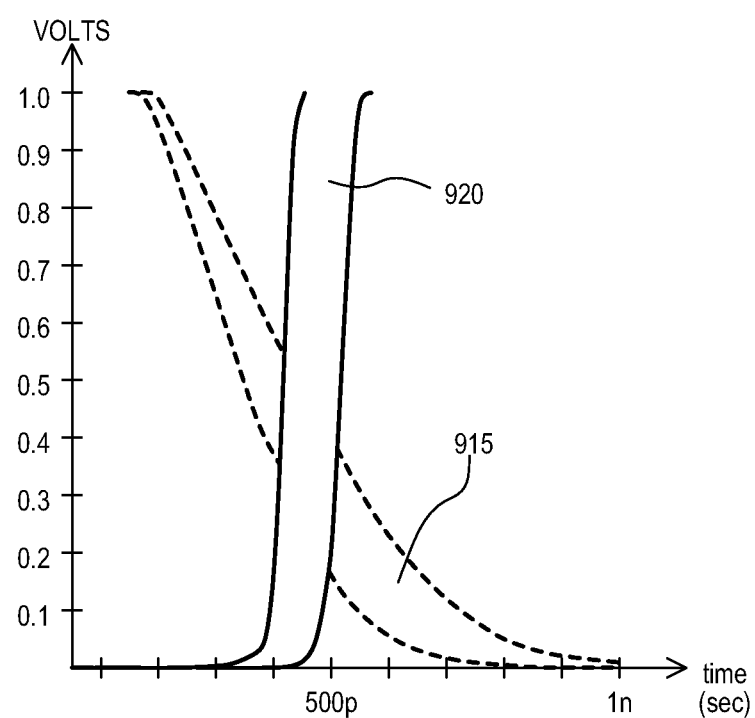
FIG. 9B illustrates bit line speed of an SRAM cell using DDC transistors in the presence of threshold voltage variations.

FIG. 9B shows simulation results for determining the read speed for an SRAM cell using DDC transistors in the presence of threshold voltage variations. FIG. 9B shows the results obtained from Monte Carlo simulations using 4000 trials performed under read operating conditions, where the word line voltage VWL is VDD, the bit line BL0 is initially precharged to VDD, and the pull-up power supply voltage is VDD. In addition, VDD is set to 1 Volt, and no body bias is applied to the transistors in the SRAM cell for these simulations. The simulation results show the bit line transition, represented by the group of falling lines 915, which are triggered by the rising edge of the voltage on the word line. The group of rising lines 920 represents the output of an inverter sense amplifier whose input is driven by the falling bit line. The simulations show that the variation in the bit line transition is significantly reduced as a result of the reduced transistor mismatch of the DDC transistors. In particular, the worst case curve is much closer to the median, which can result in a much faster worst case speed. The read speed of the SRAM cell using DDC transistors is 374 picoseconds.

The Monte Carlo simulations of FIG. 9A and FIG. 9B how that the read speed of the SRAM circuit using cells that in turn use DDC transistors is 42% faster than that of the SRAM circuit using cells that are comprised of conventional transistors as a result of the reduced threshold voltage variation. The increased read speed for the SRAM cell can be measured from the simulations performed for the SRAM cell. Thus, the SRAM cell comprised of DDC transistors has enhanced read stability, write margin, and read speed as compared to the SRAM using cells that are produced with conventional transistors.

The simulation results illustrated in FIGS. 7A, 8A, and 9A are obtained from simulations performed for SRAM cells using 28 nm technology node conventional transistors. It is noted that these simulations results are provided as an example of simulations that can be performed for SRAM cells using conventional transistors fabricated using other technology nodes. For example, similar simulation results can be obtained for simulations performed for SRAM cells using conventional transistors fabricated using other technology nodes, e.g. 65 nm, or 40 nm, etc. Similarly, the simulation results provided in FIGS. 7B, 8B, and 9B are obtained from simulations performed for SRAM cells using 28 nm technology node DDC transistors. It is noted that these simulations results are provided as an example of simulations that can be performed for SRAM cells using DDC transistors fabricated using other technology nodes. For example, similar simulation results can be obtained for simulations performed for SRAM cells using DDC transistors fabricated using other technology nodes, e.g. 65 nm, or 40 nm, etc.

Worst-case as-fabricated read SNM and write margin are typically ensured by choice of the transistor dimensions. For example, the pull-up transistors are generally as small as can be reliably fabricated; the pass-gate transistors are typically narrower and longer than the pull-down transistors to provide the necessary voltage divider ratio for the required read SNM; this in turn necessitates that the pull downs must be wide in comparison with the others. However, it is easier to manufacture transistors that are close in size—ideally all identical in size, particularly in channel length. Thus, the enhanced stability and margins provided by the DDC transistors, as well as the enhanced body coefficient and enhanced threshold voltage variation, can be used to allow design and fabrication of more lithography "friendly" SRAM cells, having substantially less, or no differences in the SRAM cell constituent transistor geometries, while still being stable and write-able. In one embodiment, SRAM cells using DDC transistors can have a cell size that is smaller compared to a cell size of a SRAM cell using conventional transistors having comparable cell stability and write margin. In alternative embodiments, SRAM cells using DDC transistors can have substantially less or no differences in the SRAM constituent transistor geometries (such as drawn transistor length and/or drawn transistor width), and therefore, can be easier to design and fabricate for lithography rules that require all transistors to be drawn to a substantially fixed pitch. The retention voltage can primarily be a function of the PMOS pull-up to NMOS pull-down ratio at reduced VDD (e.g., VDD=retention mode VDD=0.4V). The improved matching of the DDC transistor provides a lower VDD in retain mode without upsetting the cells due to mismatch in the constituent inverters.

Figure 15:
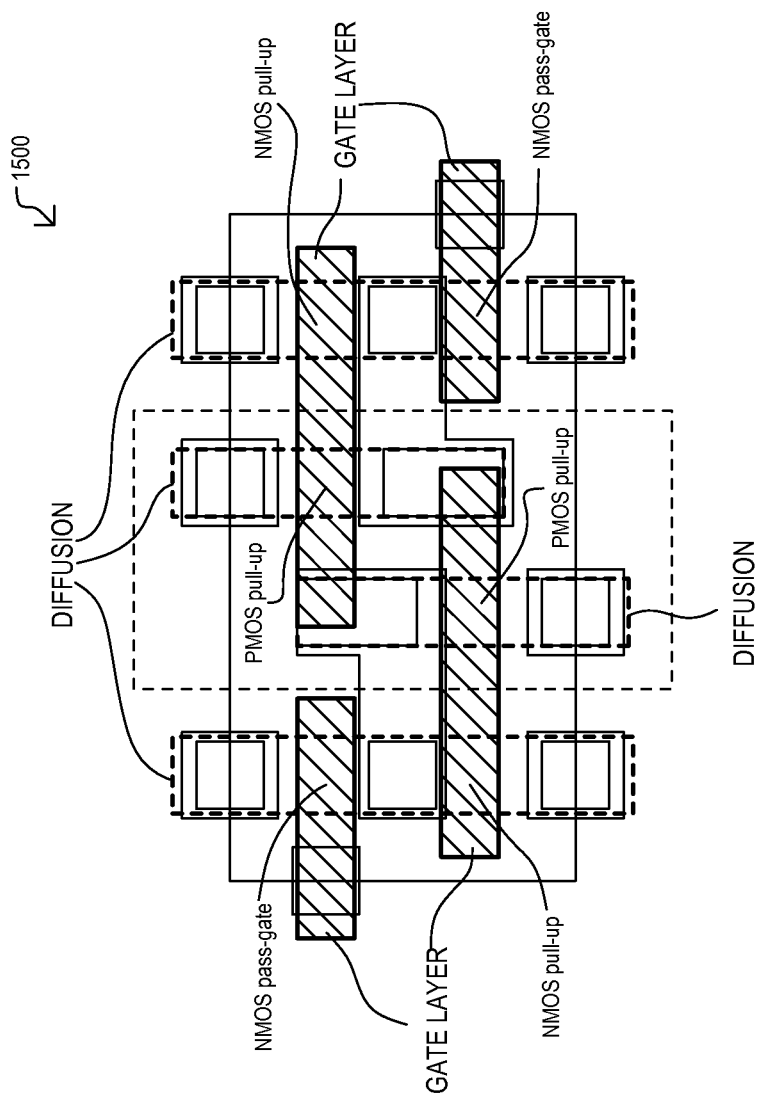
FIG. 15 illustrates a layout of a SRAM cell using DDC transistors that has substantially no jogs or notches, in accordance with one embodiment.

FIG. 15 illustrates a layout 1500 of a SRAM cell using DDC transistors that has substantially no jogs or notches in the diffusion area for the DDC NMOS transistors, in accordance with one embodiment. In addition, the layout 1500 has substantially no jogs or notches in the gate layer of the DDC NMOS pull-down transistor and the DDC PMOS pull-up transistor. In layout 1500, the length of the DDC NMOS pull-down transistor is substantially the same as the length of the DDC PMOS pull-up transistor, and the width of the DDC NMOS pull-down transistor is substantially the same the width of the DDC NMOS pass-gate transistor. In one embodiment, the threshold voltage of the DDC NMOS and DDC PMOS transistors in the SRAM cell are selected to have substantially the same value as the corresponding DDC NMOS and DDC PMOS transistors used in logic gates in the same integrated circuit device. In an alternative embodiment, the threshold voltages VTN and VTP for the DDC transistors used in the SRAM cell are optimized to provide predetermined performance characteristics for the SRAM cell, such as, read SNM, write margin, cell leakage current, bit line speed (as measured by slew rate) or read current, and data retention voltage. The process for forming the SRAM cell can determine process parameters for fabricating the SRAM cell corresponding to the layout 1500, which has the selected VTN and VTP. Such process parameters can include the thickness of the blanket epitaxial layer, the position of the screening region, the position of the threshold voltage tuning region, and/or the dopant concentration of the threshold voltage tuning region. Substantially eliminating the jogs or notches in the SRAM cell layout can reduce geometric sources of mismatch between the transistors of the SRAM cell that arise from variation in alignment and additional lithographic effects such as corner rounding. Therefore, reducing these sources of mismatch can provide a SRAM cell with enhanced performance characteristics, The predetermined cell stability resulting from the enhanced body coefficient for the DDC transistor can be obtained by using a circuit simulation program, such as the BERKELEY-SPICE simulation program, the H-SPICE simulation program, the P-SPICE simulation program, or any other circuit simulation program with similar capabilities using transistor parameters and variations in those parameters that appropriately reflect the as-manufactured transistor variability. The SPICE simulations discussed above with reference to FIGS. 2-5, are examples of how a predetermined cell stability can be obtained from SPICE simulations of the SRAM cell implemented using DDC transistors. In addition, the predetermined cell stability, write margin, and bit line speed in the presence of threshold voltage variations can be obtained from Monte Carlo simulations performed on the SRAM cell. The Monte Carlo simulations discussed above with reference to FIGS. 7A, and 7B provide examples for obtaining a predetermined cell stability in the presence of threshold voltage variations. The Monte Carlo simulations discussed above with reference to FIGS. 8A and 8B provide examples for obtaining a predetermined write margin in the presence of threshold voltage variations. The Monte Carlo simulations discussed above with reference to FIGS. 9A and 9B provide examples for obtaining a predetermined bit line speed in the presence of threshold voltage variations.

Figure 10:
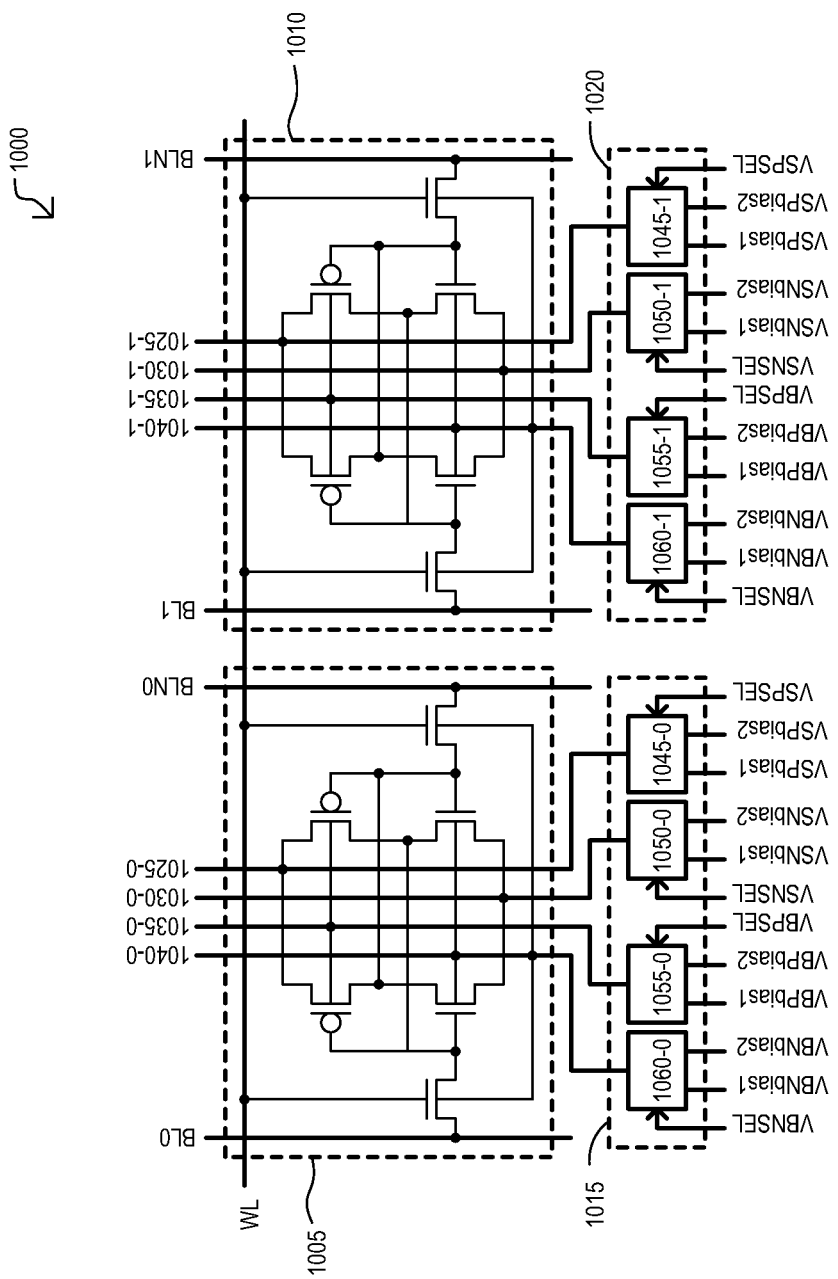
FIG. 10 illustrates an integrated circuit including static random access memory (SRAM) cells in accordance with one embodiment.

Referring to FIG. 10, an integrated circuit according to an alternative embodiment is shown in a block diagram and designated by the general reference number 1000. Integrated circuit 1000 is a SRAM device that may include a number of SRAM cells, including SRAM cells arranged in multiple rows and columns. For ease of discussion, only two SRAM cells 1005 and 1010 are illustrated along with the associated power supplies 1015 and 1020 that generate the applied power supply voltages for the SRAM cells. The SRAM cells 1005 and 1010 are implemented using DDC transistors.

In FIG. 10, the SRAM device 1000 can include different DDC PMOS source bias lines 1025-0/1 coupled to the source terminals of the DDC PMOS transistors of the SRAM cells 1005 and 1010, respectively, as illustrated in the figure. Similarly the SRAM device can include different DDC NMOS source bias lines 1030-0/1 coupled to the source terminals of the DDC NMOS transistors of the SRAM cells 1005 and 1010. In addition, the SRAM device 1000 can include different DDC PMOS body bias lines 1035-0/1 and different DDC NMOS body bias lines 1040-0/1 that are coupled to provide body bias voltages to the screening regions of the DDC PMOS and DDC NMOS transistors of the SRAM cells 1005 and 1010, respectively, as illustrated in FIG. 10.

In FIG. 10, each of the power supply blocks (e.g., power supply blocks 1015 and 1020) can couple the source bias lines 1025-0/1 and 1030-0/1, and the body bias lines 1035-0/1 and 1040-0/1 to one or more bias voltages, to thereby place the SRAM cells 1005 and 1010 into different modes of operation. In particular, the DDC PMOS source bias lines 1025-0/1 can be coupled to PMOS source bias voltage VSPbias1 or VSPbias2 as determined by the value of the PMOS source bias control signal VSPSEL. Similarly, the DDC NMOS source bias lines 1030-0/1 can be coupled to NMOS source bias voltage VSNbias1 or VSNbias2 as determined by the value of the NMOS source bias control signal VSNSEL. In addition, the DDC PMOS body bias lines 1035-0/1 can be coupled to PMOS body bias voltage VBPbias1 or VBPbias2 as determined by the value of the PMOS body bias select signal VBPSEL. Further, the DDC NMOS body bias lines 1040-0/1 can be coupled to NMOS body bias voltage VBNbias1 or VBNbias2 as determined by the value of the NMOS body bias select signal VBNSEL.

As illustrated in FIG. 10, embodiments of the SRAM device 1000, can include bias voltage sources and bias voltage networks operable to apply one or more source bias voltages and one or more body bias voltages to the DDC NMOS and DDC PMOS transistors in the SRAM cells. Table I illustrates the various combinations of source bias voltages and body bias voltages that can be applied in various embodiments of the SRAM device 1000.

TABLE I

| Embodiment | Apply more than one PMOS source bias voltage | Apply more than one NMOS source bias voltage | Apply more than one PMOS body bias voltage | Apply more than one NMOS body bias voltage |
| --- | --- | --- | --- | --- |
| 1 | Y | Y | Y | Y |
| 2 | Y | Y | Y | N |
| 3 | Y | Y | N | Y |
| 4 | Y | Y | N | N |
| 5 | Y | N | Y | Y |
| 6 | Y | N | Y | N |
| 7 | Y | N | N | Y |
| 8 | Y | N | N | N |
| 9 | N | Y | Y | Y |
| 10 | N | Y | Y | N |
| 11 | N | Y | N | Y |
| 12 | N | Y | N | N |
| 13 | N | N | Y | Y |
| 14 | N | N | Y | N |
| 15 | N | N | N | Y |
| 16 | N | N | N | N |

Various SRAM memory embodiments described above have illustrated dynamic source biasing networks, which apply different source bias voltages to the source terminals of the DDC NMOS and DDC PMOS transistors in the SRAM cells. One example of a source bias voltage switching operation is shown in a timing diagram 1100 of FIG. 11A. The timing diagram 1100 can apply to source switching circuits included in the PMOS source power supply blocks 1045-0/1, in accordance with one embodiment.

Figure 11A:
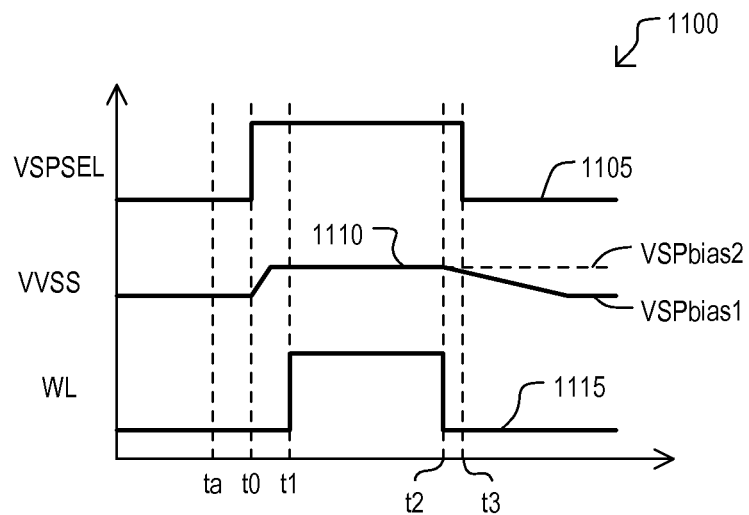
FIG. 11A is a timing diagram showing a DDC PMOS transistor source bias switching, in accordance with one embodiment.

FIG. 11A includes waveforms 1105, 1110, and 1115 corresponding to the PMOS source bias control signal VSPSEL, a source potential applied to a PMOS dynamic source bias network WSS, and a word line coupled to an accessed SRAM cell. The PMOS source bias lines 1025-0/1 can be part of one or more PMOS dynamic source bias networks in the SRAM device. For example, in embodiments that sub-divide the SRAM into several groups of SRAM cells, the source bias line 1025-0 can be part of the PMOS dynamic source bias network of one group, and the source bias line 1025-1 can be part of the PMOS dynamic source bias network of a different group.

With reference to FIG. 11A, prior to time t0, VSPSEL and WL can both be inactive (which corresponds to a low voltage level in this example). Consequently, the dynamic source bias network can be coupled to the source bias voltage VSPbias1 and WSS can be at a first PMOS source bias voltage (VSPbias1), placing the SRAM cell in a first mode.

At about time t0, VSPSEL can transition to an active level (which corresponds to a high voltage level in this example). As a result, the dynamic source bias network can be coupled to the source bias voltage VSPbias2 and WSS be at the second PMOS source bias voltage (VSPbias2), placing the SRAM cell in a second mode. In the embodiment shown, the voltage VSPbias1 is less than the voltage VSPbias2 (e.g., VSPbias1 can be the high voltage level VDD, and VSPbias2 can be a voltage that is higher than VDD).

Referring again to FIG. 11A, at about time t1, after WSS has been switched to the bias voltage VSPbias2, the word line WL can transition to an active level (which corresponds to a high voltage level in this example). As a result, a row of memory cells coupled to the word line WL can be accessed for either read or write operation. At about time t2, WL can return to an inactive level (which corresponds to a low voltage level in this example), and the row of memory cells coupled to WL are no longer accessed for read or write operations. At about time t3, after WL has returned to an inactive level, the PMOS source bias signal VSPSEL can return to an inactive level (i.e., a low voltage level). As a result the PMOS source bias network can be coupled to the source bias voltage VSPbias1 and WSS can be at the first PMOS source bias voltage (VSPbias1). In the embodiment shown, the WSS transition from VSPbias2 to VSPbias1 (which starts at about time t3) is slower than the WSS transition from VSPbias1 to VSPbias2 (which starts at about time t0). In addition, the voltage at WSS transitions to the voltage level VSPbias2 within the time interval starting at t0 and ending at t1, before the word line WL transitions to the active level.

Figure 11B:
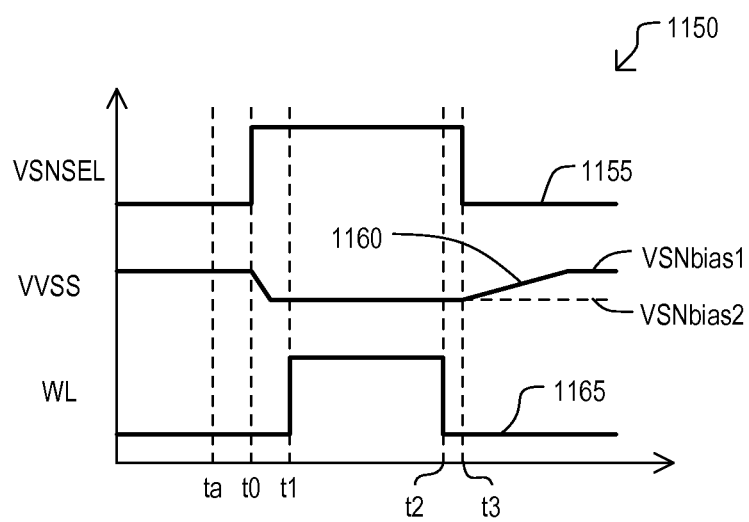
FIG. 11B is a timing diagram showing a DDC NMOS transistor source bias switching, in accordance with one embodiment.

FIG. 11B shows a timing diagram 1150 that includes waveforms 1155, 1160, and 1165 corresponding to the NMOS source bias control signal VSNSEL, a source potential applied to a NMOS source bias network WSS, and a word line coupled to an accessed SRAM cell WL. The NMOS source bias lines 1030-0/1 can be part of one or more NMOS dynamic source bias networks in the SRAM device, e.g., they can be part of the NMOS dynamic source bias networks of different groups of SRAM cell in embodiments that sub-divide the SRAM into multiple groups of SRAM cells. The transitions of these waveforms at times t0, t1, t2, and t3 are similar to the corresponding transitions described with reference to FIG. 11A, except for the fact that the voltage level VSNbias1 is higher than the voltage level VSNbias2. In the embodiment shown in FIG. 11B, the WSS transition from VSNbias2 to VSNbias1 (which starts at about time t3) is slower than the WSS transition from VSNbias1 to VSNbias2 (which starts at about time t0). In addition, the voltage at WSS transitions to the voltage level VSNbias2 within the time interval starting at t0 and ending at t1, before the word line WL transitions to the active level.

Various SRAM memory embodiments described above have illustrated dynamic source biasing networks used in conjunction with dynamic body biasing networks, where the dynamic body biasing networks apply different body bias voltages to the screen regions of the DDC NMOS and DDC PMOS transistors in the SRAM cells. One example of a body bias voltage switching operation is shown in a timing diagram 1200 of FIG. 12A. The timing diagram 1200 can apply to source switching circuits included in the PMOS body bias power supply blocks 1055-0/1, in accordance with one embodiment.

Figure 12A:
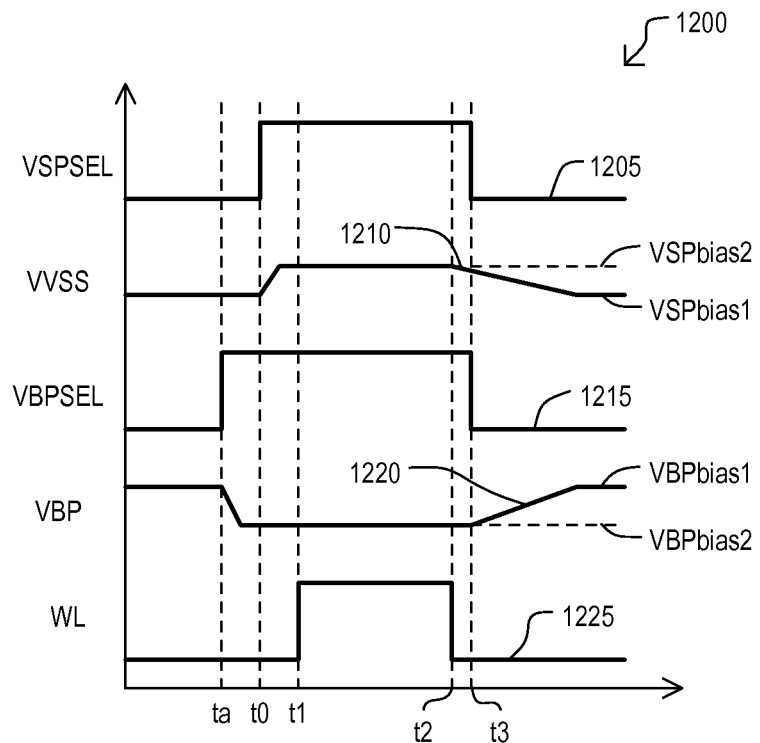
FIG. 12A is a timing diagram showing a DDC PMOS transistor source bias switching and DDC PMOS transistor body bias switching operation, in accordance with one embodiment.

FIG. 12A includes waveforms 1205, 1210, and 1225 corresponding to the PMOS source bias control signal VSPSEL, a source potential applied to a PMOS dynamic source bias network WSS, and a word line WL coupled to an accessed SRAM cell. In addition, the waveforms 1215 and 1220, corresponding to PMOS body bias control signal VBPSEL and a body bias voltage VBP applied to a PMOS dynamic body bias network. The PMOS source bias lines 1025-0/1 can be part of one or more PMOS dynamic source bias networks in the SRAM device. Similarly, the PMOS body bias lines 1035-0/1 can be part of one or more PMOS dynamic body bias networks in the SRAM device. For example, in embodiments that sub-divide the SRAM into several groups of SRAM cells, the source bias line 1025-0 can be part of the PMOS dynamic source bias network of one group, and the source bias line 1025-1 can be part of the PMOS dynamic source bias network of a different group. Similarly, the body bias line 1035-0 can be part of the PMOS dynamic body bias network of one group, and the body bias line 1035-1 can be part of the PMOS dynamic body bias network of another group.

With reference to FIG. 12A, the waveforms for VSPSEL, WSS, and WL are similar to the corresponding waveforms for these signals shown in FIG. 11A. In the embodiment shown in FIG. 12A, the operation of these waveforms and the timing relationships between these waveforms is similar to the description of these signals provided above with reference to FIG. 11A.

FIG. 12A also includes a waveform for the PMOS body bias control signal VBPSEL, and a waveform for the PMOS body bias voltage VBP. Prior to time ta, VBPSEL and WL can both be inactive (corresponding to a low voltage level in this example). Consequently, the PMOS dynamic body bias network can be coupled to the PMOS body bias voltage VBPbias1, and VBP can be at a first voltage VBPbias1, placing the SRAM cell in a third mode of operation. At about time ta, a predetermined duration of time prior to VSPSEL transitioning to the active level, VBPSEL can transition to an active level (a high voltage level in the illustrated embodiment). As a result, the PMOS dynamic body bias network can be coupled to the body bias voltage VBPbias2 and VBP can be at the second voltage VBPbias2, placing the SRAM cell in a fourth mode. In the embodiment shown, the voltage VBPbias1 is greater than the voltage VBPbias2, and the SRAM cell can have lower leakage and/or lower performance in the third mode in comparison to the fourth mode.

Referring to FIG. 12A, at about time t3, a predetermined duration of time after WL has returned to the inactive level, VBPSEL can transition to the inactive level. As a result the PMOS dynamic body bias network can be coupled to the body bias voltage VBPbias1 and VBP can be at the first PMOS source bias voltage (VBPbias1). In the embodiment shown, the VBP transition from VBPbias1 to VBPbias2 (which starts at about time ta) is faster than the VBP transition from VBPbias2 to VBPbias1 (which starts at about time t3). However, in alternative embodiments the VBP transition at time ta can be at a rate that is approximately the same or slower than the VBP transition at time t3. In addition, the voltage at VBP transitions to the voltage level VBPbias2 before VSPSEL transitions to the active level, and also before WL transitions to the active level.

Figure 12B:
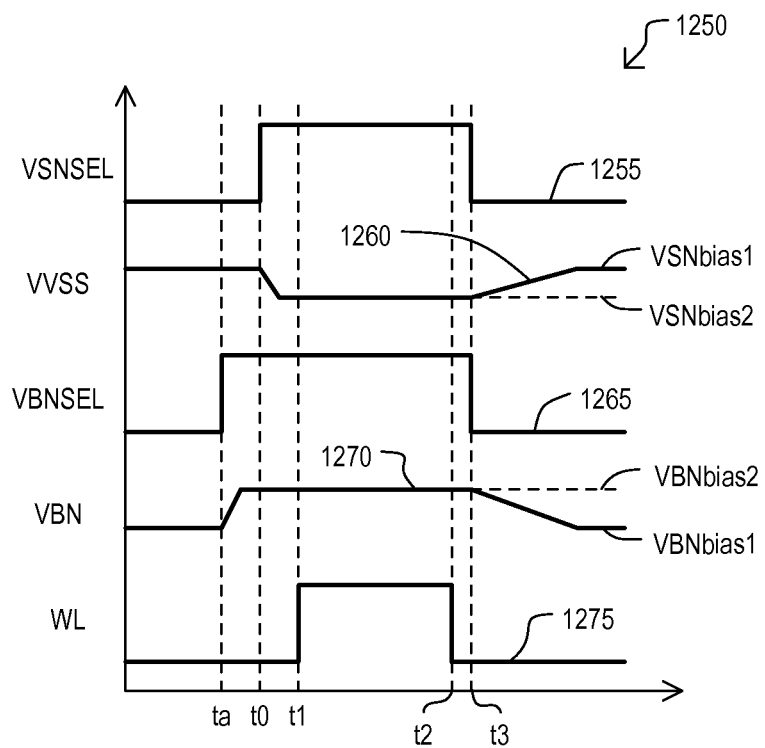
FIG. 12B is a timing diagram showing a DDC NMOS transistor source bias switching and DDC NMOS transistor body bias switching operation, in accordance with one embodiment.

FIG. 12B shows a timing diagram 1250 that includes waveforms 1255, 1260, and 1275 corresponding to the NMOS source bias control signal VSNSEL, a source potential applied to a NMOS dynamic source bias network WSS, and a word line WL coupled to an accessed SRAM cell. In addition, the waveforms 1265 and 1270, corresponding to NMOS body bias control signal VBNSEL and a body bias voltage applied to a NMOS dynamic body bias network VBN. The NMOS source bias lines 1030-0/1 can be part of one or more NMOS dynamic source bias networks in the SRAM device. Similarly, the NMOS body bias lines 1040-0/1 can be part of one or more NMOS dynamic body bias networks in the SRAM device. For example, 1030-0 and 1030-1 (and similarly 1040-0 and 1040-1) can be part of the bias networks of different groups of SRAM cell in embodiments that sub-divide the SRAM into multiple groups of SRAM cells. The transitions of these waveforms at times ta, t0, t1, t2, and t3 are similar to the corresponding transitions described with reference to FIG. 12A, except for the fact that the voltage level VBNbias1 is higher than the voltage level VBNbias2. In the embodiment shown, the VBN transition from VBNbias1 to VBNbias2 (which starts at about time ta) is faster than the VBN transition from VBNbias2 to VBNbias1 (which starts at about time t3). However, in alternative embodiments the VBN transition at time ta can be at a rate that is approximately the same or slower than the VBN transition at time t3. In addition, the voltage at VBN transitions to the voltage level VBNbias2 before VSNSEL transitions to the active level, and also before WL transitions to the active level.

In embodiments shown above, groups of memory cells may switch between modes by controlling source switching circuits and/or body bias switch circuits. In some embodiments, such circuits may be controlled in response to a decoded address. Further, a decoding path for activating source switching or body bias switching may be faster than decode paths for accessing memory cells (such as decode paths to word lines). A particular embodiment showing such a decoding arrangement is shown in FIG. 13.

Figure 13:
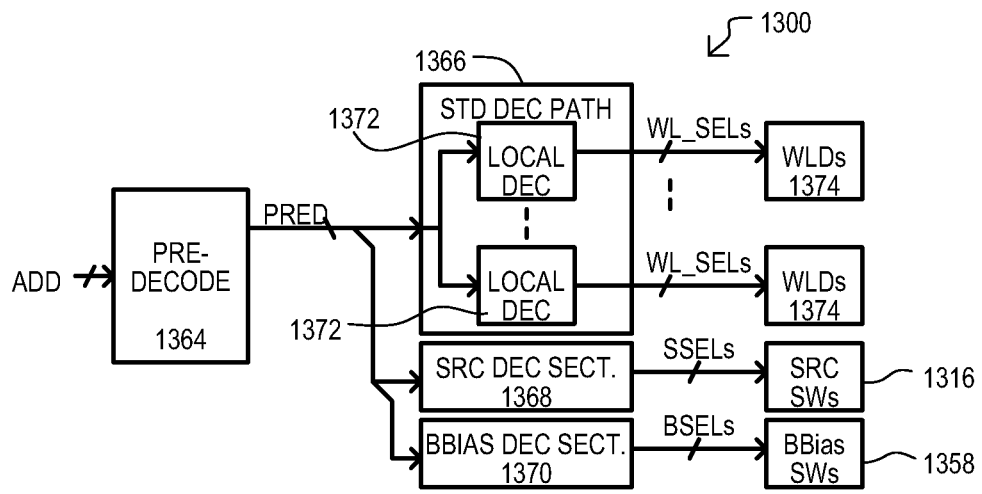
FIG. 13 is a block schematic diagram of a decoder circuit that can be included in certain embodiments.

Referring now to FIG. 13, a decoding circuit according to an embodiment is shown in block schematic diagram and designated by the general reference character 1300. A decoding circuit 1300 may include a pre-decode section 1364 and a standard decode section 1366. Decoding circuit 1300 may also include a "fast" source decode section 1368 and/or a "fast" body bias decode section 1370. It is understood that in embodiments having only dynamic source switching, a body bias decode section 1370 may not be included. Similarly, in embodiments having only dynamic body bias switching, a source decode section 1368 may not be included.

A pre-decode section 1364 may receive address values (ADD), and in response, activate pre-decode signals PRED. In the embodiment shown, pre-decode signals PRED may be applied to standard decode section 1366, applied to "fast" source decode section 1368 (if included), and applied to "fast" body bias decode section 1370 (if included).

Standard decode section 1366 may include local decoders 1372 that activate particular word line select signals (WL_SEL) according to pre-decode signals PRED. In response to word lines select signals WL_SEL, a word line may be activated by a word line driver circuit 1374.

Source decode section 1368 may receive pre-decode signals PRED and provide source select signals (SSELs). Source decode section 1368 may activate one or more source select signals (SSELs), but not all such source select signals according to pre-decode signals PRED. A source decode section

1368 may provide a faster decode operation than standard decode section 1366, activating a source select signal(s) before a word line is activated. It is noted that source decode section 1368 may receive different pre-decode signals than standard decode section 1366, or a subset of the pre-decode signals received by standard decode section 1366. When activated, each source select signal (SSELs) may activate a corresponding one of source switches 1316, for NMOS and/or PMOS devices.

In a similar fashion, body bias decode section 1370 may receive pre-decode signals PRED and provide body bias select signals (BSELs). Body bias decode section 1370 may activate one or more body bias select signals (BSELs), but not all such source select signals, according to pre-decode signals PRED. As in the case of the source decode section 1368, body bias decode section may provide a faster decode operation than standard decode section 1366. Body bias decode section 1370 may also receive different pre-decode signals than standard decode section 1366. When activated, each body bias select signal (SSELs) may activate a corresponding one of body bias switches 1358 for NMOS and/or PMOS devices.

In this way, a memory device may include a source select decode path and/or body bias decode path that is faster than a standard decode path for a word line, or the like.

While selection signals for applying source and/or bias voltages may be generated in various ways, in particular embodiments group select signals may be utilized to generate source bias and/or body bias select signals. A particular embodiment showing such a selection arrangement is shown in FIG. 14.

Figure 14:
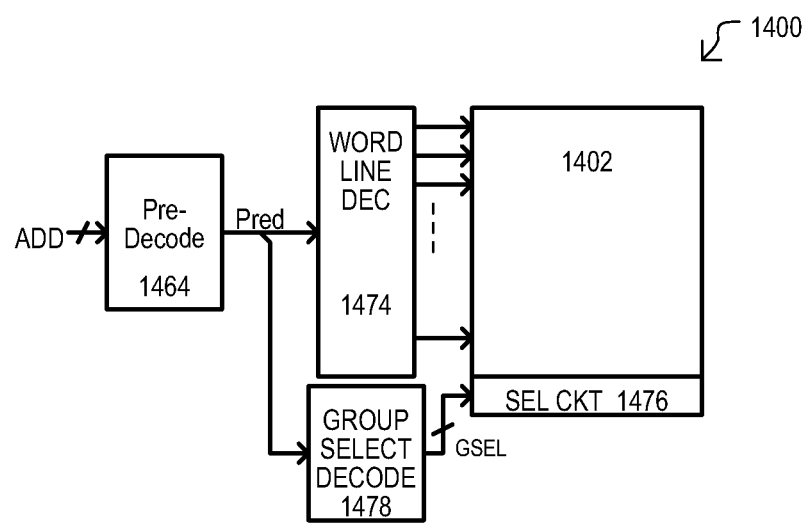
FIG. 14 is a block schematic diagram of a memory device, in accordance with one embodiment.

Referring now to FIG. 14, a memory device according to one embodiment is shown in block schematic diagram and designated by the general reference character 1400. A memory device 1400 may include a memory cell group 1402, a pre-decode section 1464, word line decoder 1474, select circuits 1476, and group select decoders 1478.

The pre-decode section may receive address values (ADD), and in response, activate pre-decode signals PRED that are coupled to the word line decoder 1474 and the group select decoder 1478. The word line decoder 1474 can include decode logic that activates particular word lines according to the pre-decode signals PRED.

The memory cell group 1402 may include memory cells arranged into multiple rows, each row being accessed by activation of a corresponding word line. In addition, memory cells of memory cell group 1402 may each have a source connection and/or a body connection to enable the memory cells to be dynamically biased.

The group select decoder 1478 can receive the predecode signal PRED, and in response, generate group select signals that select one or more cell groups in the memory device 1400. In one embodiment, group select decoder 1478 can receive different pre-decode signals than the word line decoder 1474, or it can receive a subset of the predecode signals received by the word line decoder 1474. The group select decoder 1478 can provide a faster decode than the word line decoder 1474, thereby activating the group select signals GSEL a predetermined duration of time before a word line is activated.

Select circuits 1476 may apply different bias voltages to memory cells of cell group 1402 in response to the group select signals GSEL. In some embodiments, select circuits 1476 may include source switch circuits, body bias switch circuits, or combinations thereof as shown in other embodiments, or equivalents. In one, the select circuits 1476 can apply different power supply and/or body bias voltages for each column of the group depending on whether at least one SRAM cell in the column of the group is being accessed for a read operation (read mode), or at least one SRAM cell in the column of the group is being accessed for a write operation (write mode), or none of the SRAM cells in the group are being accessed for either read or write operation (standby mode). For example, the select circuits 1476 can apply one value of body bias voltage for a column of the group that is being accessed for a write operation (i.e., at least one SRAM cell in the column is being accessed for a write operation), and a different value of body bias voltage for other columns in the group that not being accessed for a write operation. Similarly, the select circuits 1476 can apply one value of power supply voltage for a column of the group that is being accessed for a read operation, and a different value of body bias voltage for other columns in the group that are not being accessed for a read operation. The values of the body bias voltage and the power supply voltage for each column of the group can be selected independently of each other.

The group select signals (GSEL) can have a smaller granularity than a cell group. For example, the group select signals can select one or more columns within the cell group in embodiments where the select circuits 1476 apply different body bias voltages and different power supply voltages to the columns within the cell group.

Together the structures and methods of making the structures described above allow for DDC transistors having an enhanced body coefficient as compared to conventional nanoscale devices. Thus, the response of the DDC transistor can vary within a wider range to a change in the body bias voltage applied to the screening region. More specifically, the enhanced body coefficient of the DDC transistor can allow a broad range of ON-current and the OFF-current that depends on the body bias voltage applied to the screening region, as compared to the body bias voltage applied to a conventional device. In addition, the DDC transistors have a lower $\sigma V_T$ than conventional devices. The lower $\sigma V_T$ provides a lower minimum operating voltage VDD and a wider range of available nominal values of $V_T$. The enhanced body coefficient of the DDC transistor can also allow a broad range of threshold voltage that depends on the body bias voltage applied to the screening region, as compared to the body bias voltage applied to a conventional device. The screening region allows effective body biasing for enhanced control of the operating conditions of a device or a group of devices to be set by controlling the applied body bias voltage. In addition, different operating conditions can be set for devices or groups of devices as result of applying different body bias voltages.

As discussed with reference to the various embodiments above, the performance of an SRAM cell using DDC transistors can be modified by applying different bias voltages to the screening regions of the DDC NMOS transistors, and/or the DDC PMOS transistors of the SRAM cell. Therefore, SRAM cells using DDC transistors can be advantageously used in System-on-Chip (SOC) devices that include a number of different SRAMs with different performance targets. If SRAM cells using conventional transistors are used in such SOC devices, then SRAMs using different performance targets can be obtained by using additional threshold voltage set masks during fabrication to set different threshold voltages for the transistors used in the SRAM cell (typically done when the same SRAM cell design is used to obtain the different performance targets), or by using different SRAM cell designs that use differently sized transistors to obtain the different performance targets, or by using a combination of these two approaches. However, multiple SRAMs with different performance characteristics can be obtained using the same SRAM cell when it is implemented using DDC transistors, because the performance of the different SRAMs can be adjusted by applying different screening region bias voltages to the DDC transistors of the SRAM cells. Thus, a predetermined screening region bias voltage can be applied to the DDC transistors of the SRAM cell obtain a specified target performance, without using additional threshold voltage set masks and the additional process steps for setting different threshold voltages. In one embodiment, a deep N-well can be used to isolate each SRAM array from other SRAM arrays so that different body bias voltages can be applied to each SRAM array. In another embodiment, the threshold voltage of the base SRAM (i.e., the SRAM cell that does not use screening region bias voltages) is set at a higher value, and only forward bias voltages are generated for the screening region bias voltages to obtain the SRAM having different performance targets. In alternative embodiments both forward and reverse body bias voltages can be used as the screening region bias voltages.

Embodiments of the integrated circuit devices described herein can include devices that use both DDC transistors and legacy transistors. A process flow for forming such embodiments can include the process flow described with reference to FIG. 1B above, where some implants can be selectively masked over certain devices (e.g. the non-DDC transistors) that do not need the implants associated with DDC transistors. Such integrated circuit embodiments can also include hybrid SRAM cells that use both DDC transistors and legacy transistors. For example, a hybrid SRAM cell can use pair of legacy PMOS transistors as pull-up transistors, a pair of DDC NMOS transistors as pull-down transistors, and a pair of DDC pass gate transistors as pass-gate transistors.

The hybrid SRAM cell embodiments can have enhanced performance characteristics because of the DDC NMOS transistor characteristics. The DDC NMOS transistors can exhibit a higher current drive as compared to conventional MOSFETs, when a low voltage is being applied to the gate and the drain to source voltage is less than $VGS-V_T$ of the transistor, i.e., such that the transistor is operating in the linear region. The drain to source voltage on DDC NMOS pull-down transistors of the hybrid SRAM cell is diminished during a read operation, e.g., at full VDD=1.0 V, this voltage $V_{CN}$ can be lower than 0.2 V in certain embodiments. This voltage can be lower than 0.1 volts in certain alternative embodiments or at reduced VDD operation. Therefore, the higher current drive of the DDC NMOS transistors contributes to an enhanced Read SNM. In addition, during read operations, the DDC NMOS pass gate transistor of the hybrid SRAM cell has an increased body bias voltage that results from the rise in the storage node voltage during the read operation. Therefore, the enhanced body coefficient of the DDC NMOS transistor results in a DDC NMOS pass gate transistor with reduced current drive capability. The combination of the enhanced drive capability of the pull down transistor, and the reduced drive capability of the pass gate transistor results in an increased read SNM and increased cell stability. This is evident qualitatively from the better voltage divider ratio obtained by weakening the pass gate DDC NMOS transistor and strengthening the pull down DDC NMOS transistor, respectively, since the current drive is not reduced on a write, when the bit line BL is driven to or near VSS to write the cell. Thus, the hybrid SRAM cells using DDC NMOS pass-gate and DDC NMOS pull-down transistors can provide increased read SNM, and therefore, a lower read failure rate. In addition, since the DDC NMOS transistors have a lower variability of threshold voltage, i.e., lower σVT and lower AVT, the hybrid SRAM cells can have a lower VDDmin than a conventional SRAM cell that uses similarly sized conventional NMOS and PMOS transistors. In one embodiment, the hybrid SRAM cells can have a VDDmin of approximately 0.5 volts. In alternative embodiments, the hybrid SRAM cells can have a VDDmin approximately within a range of 0.35 volts to 0.5 volts.

It is noted from the description above that the DDC transistors provides an SRAM cell having an enhanced read SNM and an enhanced write margin (as shown by reduced write SNM), such that the SRAM cell has enhanced stability during read operations, and simultaneously has reduced stability during write operations that may optionally be manipulated by the designer by modulating the power supply and body bias voltages. The DDC transistors also provide an SRAM cell that has an enhanced read SNM as a result of the enhanced body coefficient and reduced threshold voltage variations, and a higher write margin as a result of the reduced threshold voltage variations.

It is understood that memory devices as shown herein, and equivalents may form an embedded memory in a larger integrated circuit and/or a standalone memory device. It is also understood that even though the foregoing discussion of exemplary embodiments has referred to SRAM cell using six transistors, it is also applicable to other SRAM cell designs. For example the foregoing discussion is also applicable to multi-ported SRAM cells having more than two pass-gate transistors. It is also applicable to SRAM cell designs that employ more than six transistors.

Still further, while the various embodiments have shown transistors arranged into memory cells, other embodiments may include different circuit types with transistors having sources and/or bodies dynamically biased as described herein. As but one example, alternate embodiments may include groups of logic cells formed with transistors in place of, or in addition to, memory cells, where such logic cell groups may be separately operated in two or more different modes with dynamic source and/or body biasing. Such logic cells may be connected to one another with metallization layers, a portion of which may form a source bias network and/or connections to drive well taps.

As another embodiment, custom logic may be designed having a source bias network and/or body bias connections as described herein. Such custom logic may be broken into sections that are dynamically biased.

In still another embodiment, a programmable logic device may have programmable logic circuit groups with transistors having dynamic source and/or body biasing as described herein. In a very particular programmable logic embodiment, such dynamically biased programmable logic transistors may be formed in conjunction with memory cells as described herein, with memory cells storing configuration data for establishing the operation of the programmable logic transistors.

Digital circuits according to the embodiments shown herein, and equivalents, may provide improved performance over conventional circuits by operating with transistors (e.g. DDC transistors) having lower threshold voltage variability. Possible improvements may include faster signal propagation times, as noted above. In addition, such improved performance can be obtained either with the application of a body bias voltage, or without the application of a body bias voltage.

Improved performance can translate into reductions in device size. For example, digital circuit transistors can be sized with respect to one another to achieve a particular response. Such sizing can take into account the enhanced body coefficient, and the enhanced threshold voltage variation of the DDC transistor. Because DDC transistors have lower threshold voltage variation, a lesser sizing margin can achieve a desired response with a smaller cell than would be required with conventional devices. As but one very particular example, SRAM cells can have a predetermined sizing between pass-gate transistors and pull-up transistors. SRAM cells using DDC transistors, in accordance with the embodiments described above can lower a relative sizing between these transistors relative to comparable SRAM cell using conventional transistors. As SRAM cells can be repeated thousands, or even millions of times in an integrated circuit, such reductions in size can extend the expected limits of size and/or performance presented by SRAM cells using conventional transistors.

In addition, such improvements may include lower operating voltages. It is noted that even though certain values of voltages have been provided in the context of the embodiments discussed above, alternate embodiments can use values of voltages that are different from the ones disclosed above. For example, in certain embodiments SRAM cells using DDC transistors can use power supply voltages that are lower than 1 Volt, e.g., 0.5 Volts. Since the DDC NMOS and DDC PMOS transistors have a lower variability of threshold voltage, i.e., lower σVT and lower AVT, the SRAM cells using DDC transistors can have a lower VDDmin than a conventional SRAM cell that uses similarly sized conventional NMOS and PMOS transistors. In one embodiment, the SRAM cells using DDC transistors can have a VDDmin of approximately 0.5 volts. In alternative embodiments, the SRAM cells using DDC transistors can have a VDDmin approximately within a range of 0.35 volts to 0.5 volts.

Various methods in accordance with the embodiments described above can be used to generate an optimized migrated SRAM cell based on a source SRAM cell, where the migrated SRAM cell uses DDC transistors and the source SRAM cell uses conventional MOSFETs, e.g., MOSFETs having dopants in the channel and/or halo implants. Such methods can be used to generate an optimized migrated SRAM cell based on the source SRAM cell, where the migrated SRAM cell is designed to be a drop-in replacement for the source SRAM cell. In one embodiment, the migrated SRAM cell can have the same area as the source SRAM cell, and each of the DDC transistors in the migrated SRAM cell can have the same size as the corresponding transistor in the source SRAM cell. In alternative embodiments, the migrated SRAM cell can be fabricated without making any modifications to the Graphic Data System (GDS) format information corresponding to the source SRAM cell. In other embodiments, the migrated SRAM cell can be fabricated using the same GDS format information as the source SRAM cell but the GDS information can be resized to produce the master or direct write information for the migrated SRAM cell. Similarly, a hybrid SRAM cell can also be generated as the optimized migrated SRAM cell, where the generated hybrid SRAM is a drop-in replacement of the source SRAM cell and uses transistors that have approximately the same size, or where the hybrid SRAM cell can be fabricated without making any modifications to the GDS format information of the source SRAM cell or making no modification other than resizing the GDS format information. In certain embodiments, the migrated cell can be smaller and/or have dimensions and layout that make it more lithography friendly, i.e., easier to fabricate at high yield. In other embodiments, the transistors of the migrated SRAM cell can use metal gates having a work function that is the same as the work function of the metal gates used for the conventional transistors of the source SRAM cell.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit comprising:
multiple SRAM cells, each SRAM cell having at least two pull-up transistors, at least two pull-down transistors, and at least two pass-gate transistors, each of the transistors having a gate; and
the pull-up transistors, the pull-down transistors, and the pass-gate transistors having a screening region positioned a distance below the gate and separated from the gate by a semiconductor layer, the screening region having a concentration of screening region dopants, the concentration of screening region dopants being higher than a concentration of dopants in the semiconductor layer,
wherein the screening region provides an enhanced body coefficient for the pull-up transistors, the enhanced body coefficient acting to increase a read static noise margin of the SRAM cell when a bias voltage is applied to the screening region.

2. The integrated circuit of claim 1 wherein the semiconductor layer is an epitaxially grown layer.

3. The integrated circuit of claim 1, wherein the screening region is formed before the creation of transistor isolation structures.

4. The integrated circuit of claim 2, wherein the epitaxially grown layer is formed before the creation of transistor isolation structures.

5. The integrated circuit of claim 1 further comprising: a power supply line connected to the sources of the two pull-up transistors of each SRAM for applying a power supply thereto, the power supply line applying a boosted power supply voltage to the pull-up transistors for one or more selected SRAM cells, wherein the enhanced body coefficient of the pull-up transistors increases a read static noise margin of the selected SRAM cell when the boosted power supply voltage is applied to the pull-up transistor.

6. The integrated circuit of claim 1 wherein the screening regions provide an enhanced body coefficient for the pull-down transistors and the pass-gate transistors to increase the read static noise margin for the SRAM cell when a bias voltage is applied to the screening region.

7. The integrated circuit of claim 1 wherein the bias voltage is a forward body bias voltage that is applied to the screening region of the pull-up transistors, the forward body bias voltage being applied during a read operation to increase the read static noise margin of the SRAM cell.

8. The integrated circuit of claim 7 wherein the applied forward body bias voltage provides a predetermined read static noise margin for the SRAM cell.

9. The integrated circuit of claim 1 wherein the bias voltage is a reverse body bias voltage that is applied to the screening region of the pull-up transistors, the reverse body bias voltage being applied during a write operation to increase the write margin of the SRAM cell.

10. The integrated circuit of claim 9 wherein the applied reverse body bias voltage provides a predetermined write margin for the SRAM cell.

11. The integrated circuit of claim 1 wherein the enhanced body coefficient provides a predetermined write margin for the SRAM cell.

12. The integrated circuit of claim 11 wherein the enhanced body coefficient provides a predetermined write margin for the SRAM cell, wherein the write margin is less than the read static noise margin.

13. The integrated circuit of claim 1, wherein:
the screening region acts to increase a current drive capacity for the pull-down transistors when the pull-down transistors are operating in a linear mode of operation, the increased current drive capacity acting to increase the read static noise margin.

14. The integrated circuit of claim 1 wherein:
the screening regions provide reduced threshold voltage variations for the pull-up transistors, the pull-down transistors, and the pass-gate transistors in the SRAM cells, the reduced threshold voltage variations to increase the write margin of the SRAM cell.

15. The integrated circuit of claim 1 wherein:
the screening region provides reduced threshold voltage variations for the pull-up transistors, the pull-down transistors, and the pass-gate transistors in the SRAM cells, the reduced threshold voltage variations acting to increase the bit line speed of the SRAM cell.

16. The integrated circuit of claim 1 wherein the SRAM cell has transistors of a first drawn transistor width and a second drawn transistor width, and wherein the pull-up transistors, the pull-down transistors, and the pass-gate transistors each have a transistor width that is selected from the first drawn transistor width or the second drawn transistor width.

17. The integrated circuit of claim 1 wherein the pull-up transistors, the pull-down transistors, and the pass-gate transistors of the SRAM cell each have a drawn transistor width, and wherein all the transistors in the SRAM cell have the same drawn transistor width.

18. The integrated circuit of claim 1 wherein the pull-up transistors, the pull-down transistors, and the pass-gate transistors of the SRAM cell each have a drawn transistor width, and wherein the pass-gate transistors and the pull-down transistors have a first drawn transistor width and the pull-up transistors have a second drawn transistor width that is different from the first drawn transistor width.

19. The integrated circuit of claim 1 wherein the pull-up transistors, the pull-down transistors, and the pass-gate transistors of the SRAM cell each have a drawn transistor length, and wherein all the transistors in the SRAM cell have the same drawn transistor length.

20. The integrated circuit of claim 1, further comprising:
a plurality of SRAM cell groups, each group having a plurality of SRAM cells;
at least one body bias control circuit to generate a body bias control signal for each group, the body bias control signal of a first group transitioning from an inactive level to an active level in response to a first received memory address selecting at least one SRAM cell in the first group; and
a body bias network for each group, the body bias network being operable to apply a first body bias voltage to the screening regions of the SRAM cells of the first group if the corresponding body bias control signal is at an inactive level, the biasing network being further operable to apply a second body bias voltage to the screening regions of the SRAM cells of the first group if the corresponding body bias control signal is at an active level, the biasing network being operable to apply the first and second body bias voltage to the SRAM cells in the first group and not an adjacent group.

21. The integrated circuit of claim 20, further including:
a plurality of word lines for each group, at least a first word line of the plurality of word lines transitioning from an inactive level to an active level in response to the first received memory address selecting at least a first row of SRAM cells in the first group, wherein the first word line transitions to the active level at least a first predetermined duration of time after the body bias control signal transitions to the active level.

22. The integrated circuit of claim 21, further comprising:
a standard decode section operable to drive the first word line to the active level if the received first memory address selects the SRAM cell in the first group of memory cells; and
a body bias decode section generating a plurality of body bias control signals in response to the first received memory address, each body bias control signal corresponding to a group of memory cells, the body bias decode section being operable to drive the body bias control signal of the first group to the active level if the received first memory address selects at least one SRAM cell in the first group;
wherein the body bias decode section drives the body bias control signal of the first group at least a first predetermined duration of time before the standard decode section drives the first word line to the active level.

23. The integrated circuit of claim 21, further comprising:
the first word line transitioning from the active level to the inactive level in response to a second received memory address not selecting the first row of SRAM cells; and
the body bias select signal of the first group transitioning from the active level to the inactive level in response to the received second memory address not selecting at least one SRAM cell in the first group,
wherein the body bias select signal of the first group transitions to the inactive level after at least a second predetermined duration of time following the first word line transitioning to the inactive level.

24. The integrated circuit of claim 1, further comprising:
a plurality of SRAM cell groups, each group having a plurality of SRAM cells;
at least one source bias control circuit to generate source bias control signals for each group, the source bias control signal of a first group transitioning from an inactive level to an active level in response to a first received memory address selecting at least one SRAM cell in the first group;
a source bias network for each group, the source bias network being operable to apply a first source bias voltage to the SRAM cells of the first group if the corresponding source bias control signal is at an inactive level, the source bias network being further operable to apply a second source bias voltage to the SRAM cells of the first group if the corresponding source bias control signal is at an active level, the source bias network being operable to apply the first and second source bias voltage to the SRAM cells in the first group and not an adjacent group.

25. The integrated circuit of claim 24, further including:
a plurality of word lines for each group, at least a first word line of the plurality of word lines transitioning from an inactive level to an active level in response to the first received memory address selecting at least a first row of SRAM cells in the first group, wherein the first word line transitions to the active level at least a third predetermined duration of time after the source bias control signal transitions to the active level.

26. The integrated circuit of claim 25, further comprising:
a standard decode section operable to drive the first word line to the active level if the received first memory address selects the SRAM cell in the first group of memory cells; and
a source bias decode section generating a plurality of source bias control signals in response to the first received memory address, each source bias control signal of the plurality of source bias control signals corresponding to a group of memory cells, the source bias decode section being operable to drive the source bias control signal of the first group to the active level if the received first memory address selects at least one SRAM cell in the first group,
wherein the source bias decode section drives the source bias control signal of the first group at least a third predetermined duration of time before the standard decode section drives the first word line to the active level.

27. The integrated circuit of claim 26, further comprising:
the first word line transitioning from the active level to the inactive level in response to a second received memory address not selecting the first row of SRAM cells; and
the source bias select signal of the first group transitioning from the active level to the inactive level in response to the received second memory address not selecting at least one SRAM cell in the first group,
wherein the source bias select signal of the first group transitions to the inactive level after at least a fourth predetermined duration of time following the first word line transitioning to the inactive level.

28. The integrated circuit of claim 1, wherein:
the pull-up transistors, the pull-down transistors, and the pass-gate transistors lack halo implant regions near the transistor source and drain that extend into the channel.

29. An integrated circuit comprising:
multiple SRAM cells, each SRAM cell having at least two pull-up transistors, at least two pull-down transistors, and at least two pass-gate transistors;
the pull-up transistors, the pull-down transistors, and the pass-gate transistors having a screening region that is formed across multiple transistors before the creation of transistor isolation structures, the screening region having a substantially uniform concentration of screening region dopants in a lateral plane, the screening regions to provide reduced threshold voltage variations for the pull-up transistors, the pull-down transistors, and the pass-gate transistors in the SRAM cells, the reduced threshold voltage variations to increase the read static noise margin of the SRAM cell.

30. The integrated circuit of claim 29 further comprising:
the pull-up transistors, the pull-down transistors, and the pass-gate transistors having a blanket epitaxial layer grown across multiple transistors to reduce migration of the screening region dopants, the blanket epitaxial layer being positioned above the screening region, the blanket epitaxial layer being grown before the creation of the transistor isolation structures,
wherein the blanket epitaxial layer and the screening region provide reduced threshold voltage variations for the pull-up transistors, the pull-down transistors, and the pass-gate transistors in the SRAM cells, the reduced threshold voltage variations acting to increase the read static noise margin of the SRAM cell.

31. The integrated circuit of claim 29 wherein the reduced threshold voltage variations to increase a worst-case write margin of the SRAM cell.

32. The integrated circuit of claim 29 wherein the reduced threshold voltage variations to increase a worst-case bit line speed of the SRAM cell.

33. A method for operating an integrated circuit comprising:
employing multiple SRAM cells, each SRAM cell having at least two pull-up transistors, at least two pull-down transistors, and at least two pass-gate transistors, each of the transistors having a gate; and
forming a screening region, the pull-up transistors, the pull-down transistors, and the pass-gate transistors having the screening region positioned a distance below the gate and separated from the gate by a semiconductor layer, the screening region having a concentration of screening region dopants, the concentration of screening region dopants being higher than a concentration of dopants in the semiconductor layer; and
applying a body bias voltage to the screening region,
wherein the screening region provides an enhanced body coefficient for the pull-up transistors, the enhanced body coefficient acting to increase a read static noise margin of the SRAM cell when a bias voltage is applied to the screening region.

* * * * *

UNITED STATES PATENT AND TRADEMARK OFFICE
CERTIFICATE OF CORRECTION

PATENT NO.          : 8,811,068 B1
APPLICATION NO.     : 13/471353
DATED               : August 19, 2014
INVENTOR(S)         : Clark et al.

Page 1 of 1

It is certified that error appears in the above-identified patent and that said Letters Patent is hereby corrected as shown below:

In the Specification

Column 2, line 39, the text "reduced a Vt" should read -- reduced σ Vt --.

Column 3, line 67, the text "reduced a Vt" should read -- reduced σ Vt --.

Column 20, line 40, the text "FIGS. 7A, and 7B" should read -- FIGS. 7A and 7B --.

Signed and Sealed this
Ninth Day of December, 2014

Michelle K. Lee
*Deputy Director of the United States Patent and Trademark Office*